(12) United States Patent
Shin

(10) Patent No.: US 12,389,529 B2
(45) Date of Patent: Aug. 12, 2025

(54) CAMERA MODULE

(71) Applicant: LG INNOTEK CO., LTD., Seoul (KR)

(72) Inventor: Won Seob Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 156 days.

(21) Appl. No.: 18/246,612

(22) PCT Filed: Sep. 28, 2021

(86) PCT No.: PCT/KR2021/013244
§ 371 (c)(1),
(2) Date: Mar. 24, 2023

(87) PCT Pub. No.: WO2022/065987
PCT Pub. Date: Mar. 31, 2022

(65) Prior Publication Data
US 2023/0371170 A1   Nov. 16, 2023

(30) Foreign Application Priority Data

Sep. 28, 2020   (KR) .................. 10-2020-0125716

(51) Int. Cl.
*H05K 1/02* (2006.01)
*H05K 9/00* (2006.01)

(52) U.S. Cl.
CPC ......... *H05K 1/0224* (2013.01); *H05K 1/0271* (2013.01); *H05K 1/0274* (2013.01);
(Continued)

(58) Field of Classification Search
CPC .. H05K 1/0224; H05K 1/0271; H05K 1/0274; H05K 9/0022; H05K 2201/09063
See application file for complete search history.

(56) References Cited

U.S. PATENT DOCUMENTS

2007/0035000 A1\* 2/2007 Hashimoto ........... H01L 23/525
257/679
2012/0051004 A1\* 3/2012 Tokuda ................ H05K 1/189
174/254

(Continued)

FOREIGN PATENT DOCUMENTS

KR   10-2019-0067112 A   6/2019
KR   10-2019-0083538 A   7/2019
(Continued)

OTHER PUBLICATIONS

International Search Report dated Jan. 21, 2022 in International Application No. PCT/KR2021/013244.

*Primary Examiner* — Minh Q Phan
(74) *Attorney, Agent, or Firm* — Saliwanchik, Lloyd & Eisenschenk

(57) ABSTRACT

A camera module according to an embodiment includes a reinforcing plate; a substrate disposed on the reinforcing plate; a lens driving unit disposed on the substrate; and an adhesive layer disposed between the reinforcing plate and the substrate, wherein the substrate includes a first cover layer including a plurality of holes; and a circuit pattern layer disposed on the first cover layer; wherein the adhesive layer is adhered contacts the circuit pattern layer through the plurality of holes.

20 Claims, 12 Drawing Sheets

(52) U.S. Cl.
CPC . *H05K 9/0022* (2013.01); *H05K 2201/09063* (2013.01); *H05K 2201/10121* (2013.01); *H05K 2201/2081* (2013.01)

(56) References Cited

U.S. PATENT DOCUMENTS

| | | | |
|---|---|---|---|
| 2015/0264806 A1* | 9/2015 | Happoya | H05K 3/38 174/251 |
| 2018/0103540 A1 | 4/2018 | Haruna et al. | |
| 2019/0373716 A1 | 12/2019 | Haruna et al. | |
| 2021/0281756 A1 | 9/2021 | Park et al. | |

FOREIGN PATENT DOCUMENTS

| | | |
|---|---|---|
| KR | 10-2019-0115020 A | 10/2019 |
| KR | 10-2020-0000938 A | 1/2020 |

* cited by examiner

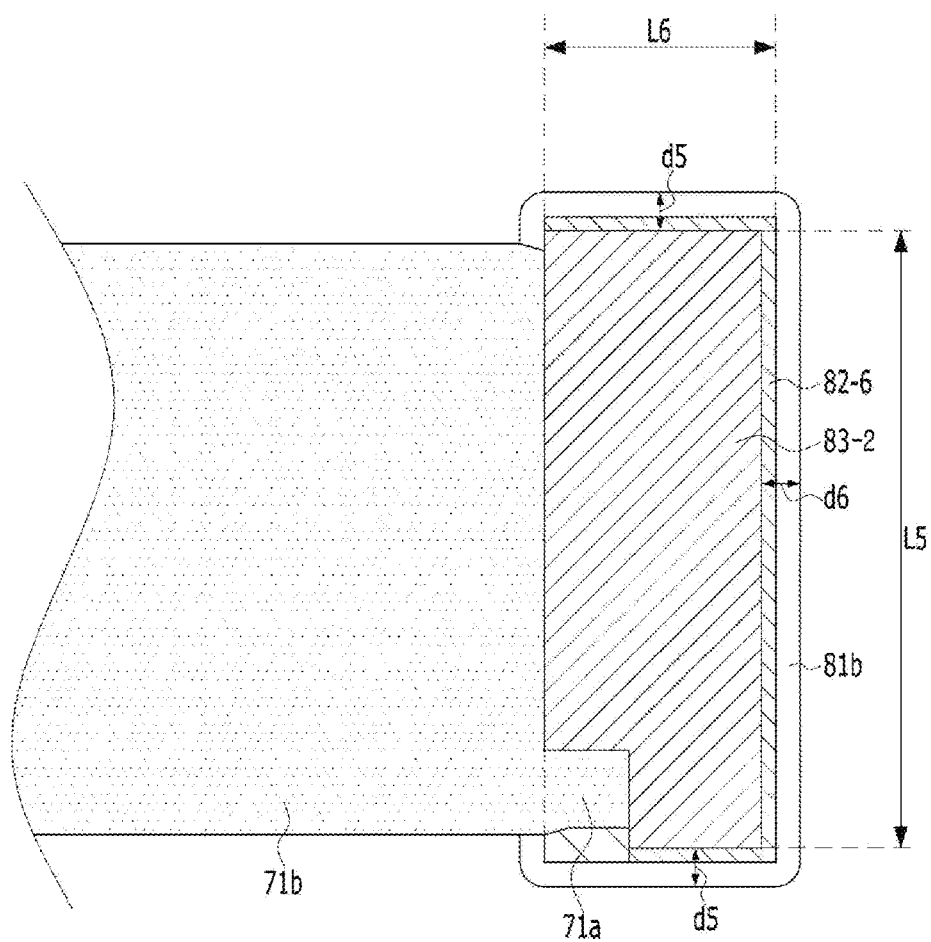

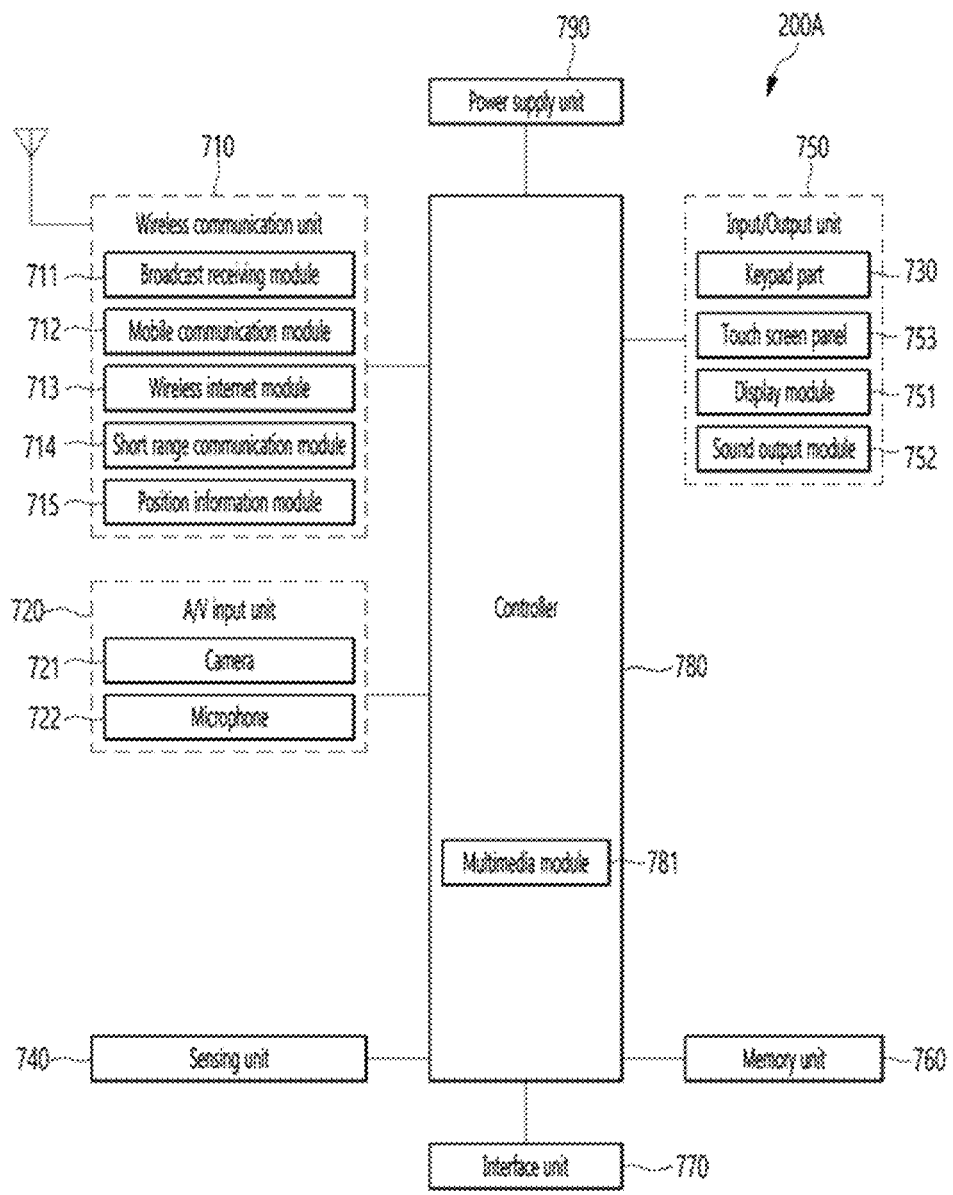

CAMERA MODULE

CROSS-REFERENCE TO RELATED APPLICATIONS

This application is the U.S. national stage application of International Patent Application No. PCT/KR2021/013244, filed Sep. 28, 2021, which claims the benefit under 35 U.S.C. § 119 of Korean Application No. 10-2020-0125716, filed Sep. 28, 2020, the disclosures of each of which are incorporated herein by reference in their entirety.

TECHNICAL FIELD

An embodiment relates to a camera module.

BACKGROUND ART

It is difficult to apply technology of a voice coil motor (VCM) used in existing general camera modules to a sub-miniature, low-power camera module, and therefore research related thereto has been actively conducted.

Demand for and production of electronic products, such as smartphones and mobile phones equipped with cameras, have increased. Cameras for mobile phones are trending toward increased resolution and miniaturization. As a result, an actuator has also been miniaturized, increased in diameter, and been made multifunctional. In order to realize a high-resolution camera for mobile phones, improvement in the performance of the camera for mobile phones and additional functions thereof, such as autofocusing, handshake correction, and zooming, are required.

DISCLOSURE

Technical Problem

The embodiment provides a camera module capable of improving adhesion between a circuit pattern layer of a substrate and a reinforcing plate.

The embodiment provides a camera module capable of improving adhesion between a ground pattern of a substrate and a reinforcing plate.

In addition, the embodiment provides a camera module capable of improving a flatness of a substrate and further improving a flatness of an image sensor disposed on the substrate, and an optical device including the same.

The embodiment provides a camera module capable of improving shielding performance of EMI noise and reducing electrical resistance between a ground of a substrate and a reinforcing plate, and an optical device including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A camera module according to an embodiment comprises a reinforcing plate; a substrate disposed on the reinforcing plate; a lens driving unit disposed on the substrate; and an adhesive layer disposed between the reinforcing plate and the substrate, wherein the substrate includes a first cover layer including a plurality of holes; and a circuit pattern layer disposed on the first cover layer; wherein the adhesive layer is adhered to the circuit pattern layer through the plurality of holes.

In addition, the first cover layer includes a first region in which the reinforcing plate is disposed, and the plurality of holes are disposed in the first region.

In addition, the circuit pattern layer includes a ground pattern, and the plurality of holes of the first cover layer and the reinforcing plate overlap each other in an optical axis direction.

In addition, the adhesive layer includes a first portion in contact with the first cover layer; and a second portion contacting the circuit pattern layer through the plurality of holes; wherein an area of the first portion is greater than an area of the second portion.

In addition, a thickness of the first portion of the adhesive layer is smaller than a thickness of the second portion.

In addition, an area of the plurality of holes of the first cover layer is smaller than an area of the circuit pattern layer.

In addition, the circuit pattern layer includes a first portion in contact with the first cover layer; and a second portion in contact with the adhesive layer through the plurality of holes, wherein an area of the first portion of the circuit pattern layer is greater than an area of the second portion of the circuit pattern layer.

In addition, the adhesive layer includes a conductive particle connecting the circuit pattern layer and the reinforcing plate.

In addition, each of the plurality of holes has a diameter in a range of 0.1 mm to 0.5 mm, and a distance between centers of the plurality of holes has a range of 0.8 mm to 1.2 mm.

On the other hand, a camera module according to an embodiment comprises a reinforcing plate; a substrate disposed on the reinforcing plate; a lens driving unit disposed on the substrate; and an adhesive layer disposed between the reinforcing plate and the substrate, wherein the substrate includes a first cover layer including a plurality of holes; and a ground pattern disposed on the first cover layer; wherein the adhesive layer contacts the reinforcing plate and contacts the ground pattern through the plurality of holes.

In addition, the ground pattern and the reinforcing plate overlap in an optical axis direction.

In addition, the first cover layer includes a first region where the reinforcing plate is disposed, and the plurality of holes are disposed in the first region.

In addition, the adhesive layer include a first portion in contact with the first cover layer and a second portion in contact with the ground pattern through the plurality of holes, and an area of the first portion is greater than an area of the second portion.

In addition, an area of the plurality of holes of the first cover layer is smaller than an area of the ground pattern.

In addition, the adhesive layer includes a conductive particle connecting the ground pattern and the reinforcing plate.

In addition, each diameter of the plurality of holes has a range of 0.1 mm to 0.5 mm, and a distance between centers of the plurality of holes has a range of 0.8 mm to 1.2 mm.

On the other hand, the camera module according to the embodiment comprises a first reinforcing plate; a first substrate disposed on the first reinforcing plate; a lens driving unit disposed on the first substrate; and a first adhesive layer disposed between the first reinforcing plate and the first substrate; a second reinforcing plate; a second substrate disposed on the second reinforcing plate; a connector disposed on the second substrate; a shielding sheet disposed between the second reinforcing plate and the second substrate; and, a connection substrate electrically connecting the first substrate and the second substrate; wherein the first substrate includes a first cover layer including a plurality of holes; and a circuit pattern layer disposed on the first cover layer; wherein the adhesive layer is adhered to the circuit pattern layer through a plurality of holes, and the second substrate includes a second cover layer including an open region, and at least a portion of the shielding sheet is disposed in the open region.

Effects of the Invention

According to an embodiment, it includes a first reinforcing plate connected to a ground pattern formed on a first region of a substrate. In this case, the substrate includes a cover layer having an opening exposing the ground pattern. In this case, the opening of the cover layer partially exposes the ground pattern instead of fully exposing the ground pattern. Specifically, the cover layer has a plurality of holes spaced apart from each other and partially exposing the ground pattern. Accordingly, the first adhesive member includes a first portion disposed in the hole of the cover layer and contacting the ground pattern, and a second portion in contact with the cover layer. In addition, a first reinforcing plate may be attached on the first adhesive member. According to this, the embodiment allows the opening of the cover layer to partially expose the ground pattern in the form of a dot without fully exposing the ground pattern, and accordingly, the first adhesive member may contact the cover layer as well as the ground pattern, thereby improving an adhesive strength of the first adhesive member. Specifically, the first adhesive member has higher adhesive strength with the cover layer than adhesive strength with the ground pattern, so that the adhesive strength of the first adhesive member can be improved compared to the comparative example. Furthermore, the embodiment allows an area in contact with the cover layer to be larger than an area in contact with the ground pattern among a total area of the first adhesive member, so that it is possible to secure better adhesion of the first adhesive member.

In addition, the embodiment allows the opening of the cover layer to have a dot shape rather than a full shape that opens the ground pattern as a whole, and accordingly, it can improve the flatness of the substrate and image sensor. That is, when the opening of the cover layer has a full shape, an issue of being dented in a region where the opening of the cover layer is formed occurs in a process of laminating the first reinforcing plate, and this causes a problem with the flatness of the substrate and furthermore the flatness of the image sensor mounted on the substrate. In contrast, the embodiment allows the opening of the cover layer to have a dot shape for partial exposure, so that it can minimize the occurrence of warpage during lamination of the first reinforcing plate, and accordingly, it can improve the flatness of the substrate and furthermore the flatness of the image sensor.

In addition, the embodiment can improve the shielding performance of EMI noise, it can reduce the electrical resistance between the ground pattern of the substrate and the reinforcing plate, and thereby improve the RF sensitivity.

DESCRIPTION OF DRAWINGS

FIGS. 8A to 8D show a process of coupling a noise shielding unit, a second adhesive member, and a second reinforcing plate to a substrate.

FIG. 11 is a configuration diagram of a portable terminal shown in FIG. 9.

BEST MODE

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

A camera module according to an embodiment may perform an 'auto focusing function'. Here, the auto-focusing function refers to automatically focusing an image of a subject on an image sensor surface.

In addition, the camera module according to the embodiment may perform 'hand shake correction function'. Here, the hand shake correction function refers to inhibiting an outline of a captured image from being blurry due to vibration caused by a user's hand shake when capturing a still image.

Figure 1:
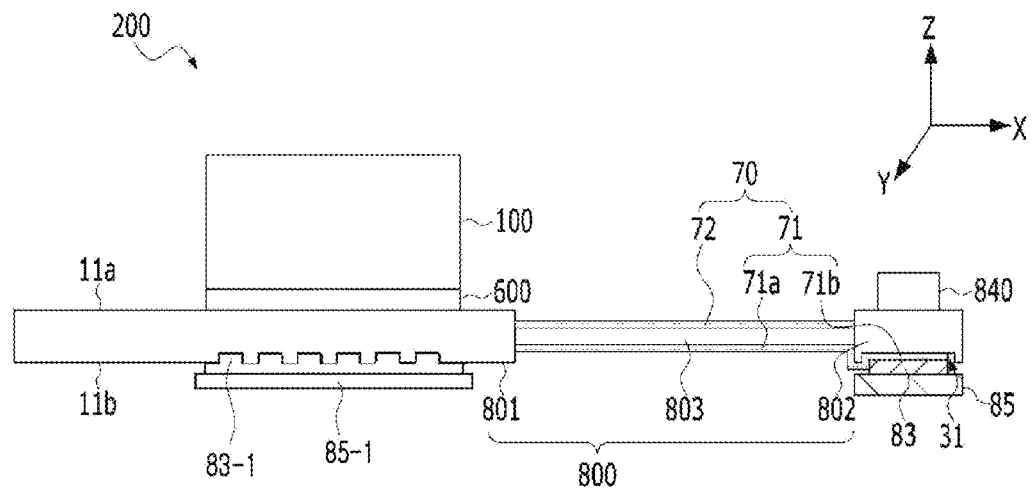
FIG. 1 shows a cross-sectional view of a camera module according to an embodiment.

FIG. 1 shows a cross-sectional view of a camera module 200 according to an embodiment.

Referring to FIG. 1, the camera module 200 includes a substrate 800, a holder 600 disposed on the substrate 800, a lens driving unit 100 mounted on the holder 600, a connector 840 disposed on the substrate 800, a noise shielding unit 70 disposed on the substrate 800, a reinforcing plate 85-1 and 85-2 disposed on the substrate 800, and an adhesive member 83-1 and 83-2 disposed between the reinforcing plates 85-1 and 85-2 and the substrate 800. For example, the reinforcing plate includes a first reinforcing plate 85-1 disposed in a first region 801 of the substrate 800 and a second reinforcing plate 85-2 disposed in a third region 803 of the substrate 800. In addition, the adhesive member includes a first adhesive member 83-1 disposed between the first region 801 of the substrate 800 and the first reinforcing plate 85-1, and a second adhesive member 83-2 disposed between the third region 803 of the substrate 800 and the second reinforcing plate 85-2.

The substrate 800 may include a plurality of pattern layers, an insulating layer disposed between the pattern layers, a cover layer disposed on an outermost pattern layers to protect the pattern layers, and a contact (or via) electrically connecting the pattern layers. The cover layer may be a solder resist (SR, Solder Resist).

The substrate 800 may include a first region 801 where the lens driving unit 100 is disposed, a second region 802 where the connector 840 is disposed, and a third region 803 connecting the first region 801 and the second region 802.

The first region 801 of the substrate 800 can be expressed as a "first substrate", the second region 802 of the substrate can be expressed as a "second substrate", and the third region 803 of the substrate 800 may be expressed as a "connection substrate".

In another embodiment, the first region 801 of the substrate 800 or the first substrate may be included in the lens driving unit 100.

Each of the first region 801 and the second region 802 of the substrate 800 may include a flexible substrate 800-1 and a rigid substrate 800-2 and 800-3. This is because the first region 801 and the second region 802 of the substrate 800 require constant strength to support the lens driving unit 100 and the connector 840.

For example, each of the first region 801 and the second region 802 of the substrate 800 may include a first rigid substrate 800-2 disposed on a flexible substrate 800-1 and a second rigid substrate 800-2 disposed under the flexible substrate 800-1.

The third region 800-1 of the substrate 800 may include a flexible substrate 800-1. The flexible substrate 800-1 included in the first to third regions 800-1 to 800-3 of the substrate 800 may be integrally formed.

As described above, the first region 801 and the second region 802 of the substrate may be a rigid substrate, and the third region 803 may be a flexible substrate, but is not limited thereto. In another embodiment, at least one of the first to third regions 801 to 803 of the substrate 800 may include a rigid substrate and the others may include a flexible substrate.

Figure 2:
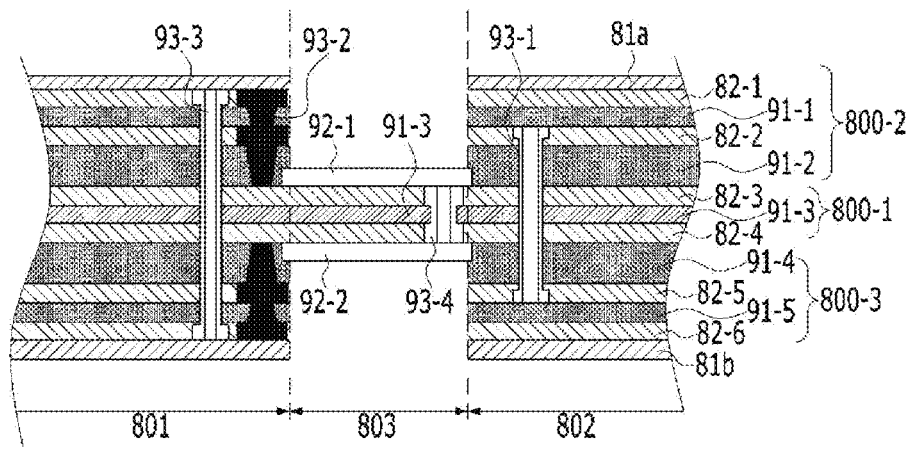
FIG. 2 shows a cross-sectional view of the substrate shown in FIG. 1 according to an embodiment.

FIG. 2 shows a cross-sectional view of the substrate 800 shown in FIG. 1 according to an embodiment.

Referring to FIG. 2, a substrate 800 may include a plurality of pattern layers 82-1 to 82-6 disposed spaced apart from each other in an optical axis direction or in a vertical direction, insulating layers 91-1 to 91-5 (or insulators, insulating films) disposed between the plurality of pattern layers 82-1 to 82-6 and insulating between the plurality of pattern layers 82-1 to 82-6, and cover layers 81a, 81b, 92-1, and 92-2 for protecting the plurality of pattern layers 82-1 to 82-6 from external impact.

In FIG. 2, the flexible substrate 800-1 may include an insulating layer 91-3, a pattern layer 82-3 disposed on the insulating layer 91-3, and a pattern layer 82-4 disposed below the insulating layer 91-3.

The first rigid substrate 800-2 may includes pattern layers 82-1 and 82-2 disposed on the flexible substrate 800-1 (eg, pattern layer 82-3), and insulating layers 91-1 and 91-2 disposed between the flexible substrate 800-1 (eg, pattern layer 82-3) and a first rigid substrate 800-2 (eg, pattern layer 82-2) and between the pattern layers 82-1 and 82-2.

The second rigid substrate 800-3 may include pattern layers 82-5 and 82-6 disposed below the flexible substrate 800-1 (eg, the pattern layer 82-4), and insulating layers 91-4 and 91-5 disposed between the flexible substrate 800-1 (eg, the pattern layer 82-4) and the second rigid substrate 800-3 (eg, the pattern layer 82-5) and between patterned layers 82-5 and 82-6.

The insulating layer 91-3 of the substrate 800 may be a flexible insulating layer that is flexibly bent, for example, polyimide.

The insulating layers 91-1 to 91-2 and 91-4 to 91-5 of the substrate 800 may be a rigid insulating layer or a prepreg having greater strength or greater hardness than the flexible insulating layer.

For example, the pattern layers 82-1 to 82-6 may be referred to as a copper foil, a conductive layer, or a conductive pattern, and the insulating layers 91-1 to 91-5 may be referred to as an insulator or an insulating film.

In FIG. 2, a number of pattern layers of the flexible substrate 800-1 is two, and a number of pattern layers of each of the first and second rigid substrates 800-2 and 800-3 is two. However, it is not limited thereto, and a number of pattern layers of the flexible substrate 800-1 and a number of pattern layers of each of the first and second rigid substrates 800-2 and 800-3 in another embodiment may be one or more.

The cover layer of the substrate 800 may include a cover layer 81a disposed on the pattern layer 82-1 of the first rigid substrate 800-2, a cover layer 81b disposed on the pattern layer 82-6 of the second rigid substrate 800-3, a cover layer 92-1 disposed on the pattern layer 82-3 of the flexible substrate 800-1 of the third region 803, and a cover layer 92-2 disposed under the pattern layer 82-4 of the flexible substrate 800-1 of the third region 803. The cover layer of the substrate 800 may be an insulating material such as a solder resist.

In addition, the substrate 800 may include a via for electrically connecting two pattern layers among the pattern layers 82-1 to 82-6 of the flexible substrate 800-1 and the first and second rigid substrates 800-2 and 800-2. Here, the via may be referred to as a contact or a contact via.

For example, the substrate 800 may include at least one via 93-4 for electrically connecting between the pattern layers 93-4 of the flexible substrate 800-1, and at least one via 93 for electrically connecting two pattern layers of the pattern layers 82-1 to 82-6 of the first and second rigid substrates 800-2 and 800-2-1 to 93-4.

The substrate 800 may include an opening 31 and 32. The opening 31 and 32 may be an open region formed on the substrate 800. For example, the opening 31 and 32 may be a hole exposing at least one pattern layer among pattern layers formed on the substrate. Accordingly, the opening 31 and 32 may be expressed as "opening", "open region", "open part", "hole", and "recess".

Specifically, the substrate 800 may include a first opening 32 formed in the first region 801 of the substrate 800 and a second opening 31 formed in the second region 802 of the substrate 800.

The first opening 32 may expose the pattern layer 82-6 of the substrate 800 from the lower surface of the first region 801 of the substrate 800. The pattern layer 82-6 may include a ground pattern. Specifically, the first opening 32 may expose a ground pattern among the pattern layers 82-6 formed in the first region 801 of the substrate 800.

For example, the pattern layer 82-6 may be a pattern layer including a circuit pattern and a ground pattern. Alternatively, the pattern layer 82-6 may be a ground layer including only a ground pattern. Accordingly, the pattern layer 82-6 may be expressed as a "pattern layer including a ground pattern" or a "ground layer" or a "ground part" including only a ground pattern.

The second opening 31 may expose the pattern layer 82-6 of the substrate 800 from a lower surface of the second region 802 of the substrate 800. The pattern layer 82-6 may include a ground pattern. Specifically, the second opening 31 may expose the ground pattern of the pattern layer 82-6 formed in the second region 802 of the substrate 800. Accordingly, the pattern layer 82-6 may include a "ground pattern" or may be expressed as a "ground layer" or "ground layer".

The first opening 32 and the second opening 31 may have different shapes. The first opening 32 may have a dot shape. For example, the first opening 32 may include a plurality of openings. For example, the first opening 32 may include a plurality of openings spaced apart from each other and partially exposing the ground pattern formed under a lower surface of the first region 801 of the substrate 800.

The second opening 31 may have a full shape. For example, the second opening 31 may include one opening. For example, the second opening 31 may include one opening fully exposing the ground pattern formed under the lower surface of the second region 802 of the substrate 800.

That is, the first region 801 of the substrate 800 is a region in which an image sensor and a lens driving device are disposed, and thus may be a region in which flatness is important. In contrast, the second region 802 is a region where a connector is disposed, and thus may be a region in which flatness is not important compared to the first region 801. Accordingly, the embodiment allows forming the first opening 32 and the second opening 31 that are optimal for each region of the substrate 800, so that it can improve an adhesion between the substrate 800 and the reinforcing plates 85-1 and 98-2 while improving the flatness of the substrate 800.

Meanwhile, a partial region of the ground pattern 82-6 exposed through the first opening 32 and the second opening 31 may form a lower surface of each of the first opening 32 and the second opening 31.

A holder 600 may be disposed on the first region 801 of the substrate 800, and a lens driving unit 100 may be disposed or mounted on the holder 600 disposed on the substrate 800.

A connector 840 may be disposed on a second region 802 of substrate 800 (or "second substrate"). For example, the connector 840 may be disposed on one surface of the second region 802 of the substrate 800.

A "connector unit" may be composed of the connector 840, the second region 802 (or second substrate) of the substrate 800, at least a part of the noise shielding unit 70, and the second reinforcing plate 85-2.

For example, the holder 600 and the lens driving unit 100 may be disposed on a first surface 11a of the first region 801 of the substrate 800, and the connector 840 may be disposed on a first surface 11a of the second region 802 of the substrate 800.

Terminals of the lens driving unit 100 may be electrically connected to at least one of the pattern layers (eg, 82-1 to 82-6) of the first region 801 of the substrate 800, and terminals of the connector may be electrically connected to at least one of the pattern layers 82-1 to 82-6 of the second region 802 of the substrate 800.

For example, the terminals of the lens driving unit 100 may be electrically connected to the pattern layers 82-3 and 82-4 of the flexible substrate 800-1 of the first region 801, the terminals of the connector 840 may be electrically connected to the pattern layers 82-3 and 82-4 of the flexible substrate 800-1 of the second region 802 of the substrate 800, and terminals of the lens driving unit 100 and terminals of the connector 840 may be electrically connected by the flexible substrate 800-1.

A noise shielding unit 70 may be disposed under the second region 802 of the substrate 800.

In addition, the noise shielding unit 70 may be disposed above and below the flexible substrate 800-1 of the third region 803 of the substrate 800. The noise shielding unit 70 may be referred to as a noise shielding layer, an "electromagnetic interference (EMI) blocking unit", an EMI shielding unit, an EMI film, or an EMI tape.

The noise shielding unit 70 may include a first noise shielding unit 71 and a second noise shielding unit 72.

The first noise shielding unit 71 may be disposed below the second region 802 and the third region 803 of the substrate 800. For example, the first noise shielding unit 71 may include a first portion 71a (or first region) disposed in the second opening 31 of the second region 802 of the substrate 800 and a second portion 71b (or second region) disposed under the flexible substrate 800-1 of the third region 803 of the substrate 800.

The second noise shielding unit 72 may be disposed on the third region 803 of the substrate 800.

In addition, the noise shielding unit 70 may further include a portion disposed on an upper surface of the third region 803 of the substrate 800 or/and disposed on the lower surface of the first region 803 of the substrate 800.

The second portion 71b of the first noise shielding unit 71 may be disposed or formed only in a part of the third region 803 (or connection substrate).

In addition, the first noise shielding unit 71 may further include a third portion 71c disposed between the first portion 71a and the second portion 71b and connecting the first portion 71a and the second portion 71b.

For example, the third portion 71c may be disposed on a lower surface (or cover layer 81b) of the second region 802 of the substrate 800 connecting a fourth inner surface 31d of the second opening 31 and a fourth outer surface 5*d* of the second region 802 of the substrate 800.

The first reinforcing plate 85-1 may be disposed below the first region 801 of the substrate 800 (or "first substrate"). For example, the first reinforcing plate 85-1 may be disposed below a ground pattern disposed below the first region 801 of the substrate 800. In this case, a ground pattern exposed through the first opening 32 among the pattern layers disposed in the first region 801 of the substrate 800 may be referred to as a "first ground pattern" for convenience of description.

The second reinforcing plate 85-2 may be disposed under the second region 802 of the substrate 800 (or "second substrate"). For example, the second reinforcing plate 85-2 may be disposed below the first portion 71*a* of the first noise shielding unit 71 disposed below the second 81*b*) region 802 of the substrate 800. Also, a ground pattern exposed through the second opening 31 among the pattern layers disposed in the second region 802 of the substrate 800 may be referred to as a "second ground pattern" for convenience of explanation.

The second reinforcing plate 85-2 may be disposed on the second opening 31 of the second substrate 802 and the upper surface of the second substrate 802.

In addition, the first reinforcing plate 85-1 and the second reinforcing plate 85-2 may be formed of a conductive material having high thermal conductivity, for example, a metal material. For example, the first reinforcing plate 85-1 and the second reinforcing plate 85-2 may be formed of SUS, aluminum, or the like, but are not limited thereto.

In addition, the first reinforcing plate 85-1 and the second reinforcing plate 85-2 may be electrically connected to a ground terminal of the substrate 300, specifically the first ground and the second ground pattern, so that may serve as a ground to protect the camera module from ESD (Electrostatic Discharge Protection).

A first adhesive member 83-1 may be disposed between the first reinforcing plate 85-1 and the first ground pattern. In addition, the first adhesive member (83-1) is disposed between a cover layer 81*b* formed in the first region 801 of the substrate 800 and having the first opening 32 and the first reinforcing plates 85-1. In this case, the cover layer 81*b* disposed in the first region 801 of the substrate 800 may be referred to as a "first cover layer".

The second adhesive member 83-2 may be disposed between the second reinforcing plate 85-2 and the first noise shielding unit 71. In this case, the cover layer 81*b* disposed in the second region 802 of the substrate 800 and having the second opening 31 may be referred to as a "second cover layer" for convenience of description.

The second adhesive member 83-2 is disposed between the first portion 71*a* of the first noise shielding unit 71 and the second reinforcing plate 85-2, and fixes or attaches the second reinforcing plate 85-2 to the second region 802 of the substrate 800.

Figure 3:
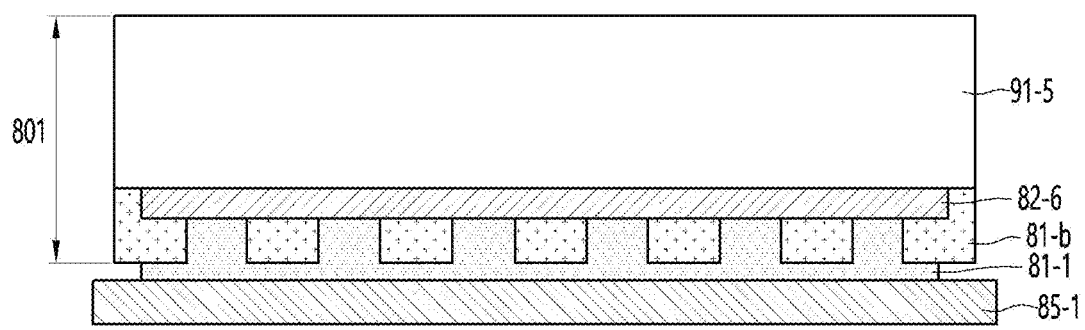
FIG. 3 is a cross-sectional view of a first substrate or a first region of a substrate according to an embodiment.

Meanwhile, in FIG. 3, an upper surface of the first reinforcing plate 85-1 may be spaced apart from a lower surface of the first region 801 of the substrate 800 (eg, the lower surface of the first cover layer).

Figure 6:
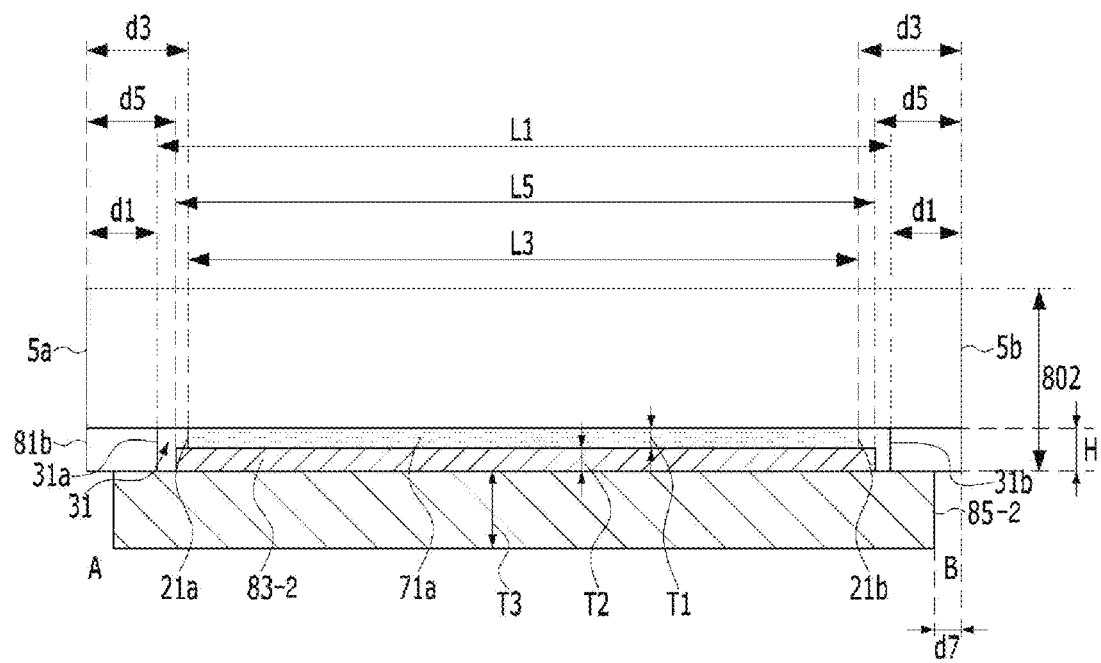
FIG. 6 is a cross-sectional view of a second region of a substrate in a first direction according to an embodiment.

In addition, in FIG. 6, an upper surface of the second reinforcing plate 85-2 may be spaced apart from the lower surface of the second substrate 802 (eg, the lower surface of the second cover layer), but is not limited thereto. In another embodiment, in FIG. 6, the upper surface of the second reinforcing plate 85-2 may be in contact with the lower surface of the second region 802 of the substrate 800 (eg, the lower surface of the second cover layer).

The first adhesive member 83-1 may include a portion disposed in the first opening 32 of the first region 801 of the substrate 800 and a portion disposed on the first cover layer of the first region 801 of the substrate 800.

In addition, a portion of the second adhesive member 83-2 may be disposed within the second opening 31 of the second substrate.

The second region 802 (or second substrate) of the substrate 800 according to the embodiment may provide a second opening 31 having an opening exposing a portion of the pattern layer (eg, 82-6, see FIG. 2).

Here, one region of the pattern layer 82-6 exposed by the second opening 31 corresponds to a ground pattern for the ground of the substrate 800 or can be electrically connected to the ground of the substrate 800.

In addition, one region of the pattern layer 82-6 exposed by the second opening 31 may be electrically connected to a ground pin or terminal of the connector 840.

For example, the second opening 31 opens a part of the cover layer 81*b* of the second region 802 of the substrate 800, and a lower surface of a part of the pattern layer (eg, 82-6, see FIG. 2) of the second region 802 may be opened by the second opening 31.

The first noise shielding unit 71 may be disposed in the second opening 31 of the second region 802 of the substrate 800. At least a portion of an edge of the first noise shielding unit 71 may be disposed within the second opening 31.

For example, the first portion 71*a* of the first noise shielding unit 71 may be disposed within the second opening 31 of the second region 802 of the substrate 800.

In addition, the second adhesive member 83-2 may be disposed on the first noise shielding unit 71 disposed in the second opening 31, and the second reinforcing plate 85-2 may be disposed on the second adhesive member 83-2.

A first portion 71*a* of the first noise shielding unit 71 is disposed in the second opening 31 of the second region 802 of the substrate 800, and a second adhesive member 83-2 is disposed on the first portion 71*a* of the first noise shielding unit 71 disposed in the second opening 31, so that the embodiment can shield or reduce noise emitted from the camera module, and it can reduce resistance between the second reinforcing plate 85-2 and the substrate 800 (eg, the ground (GND) of the substrate 800).

Hereinafter, an adhesive structure of the first reinforcing plate 85-1 and the second reinforcing plate 85-2 disposed in each of the first region 801 and the second region 802 of the substrate 800 will be described in detail.

First, the structures of the first region 801 of the substrate 800 or the first adhesive member 83-1 and the first reinforcing plate 85-1 disposed on the first substrate 801 will be described.

Figure 4:
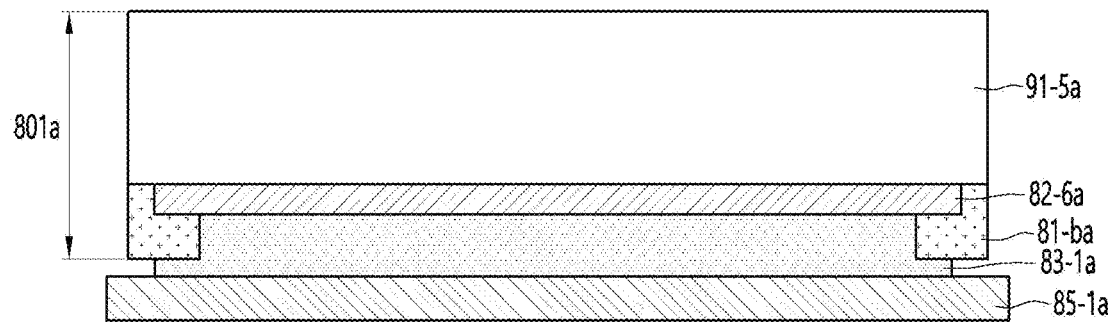
FIG. 4 is a cross-sectional view of a first substrate or a first region of a substrate according to a comparative example.

FIG. 3 is a cross-sectional view of a first substrate or a first region of a substrate according to an embodiment, FIG. 4 is a cross-sectional view of a first substrate or a first region of a substrate according to a comparative example, and FIGS. 5A to 5D are views illustrating a process of coupling a first adhesive member and a first reinforcing plate to a first substrate or a first region of a substrate according to an embodiment.

Referring to FIG. 3, a first substrate 801 or a first region 801 of a substrate 800 includes an insulating layer, a pattern layer, and a cover layer. In this case, the insulating layer 91-5 formed on the first substrate 801 or the first region 801 of the substrate 800 is referred to as a "first insulating layer", the pattern layer 82-6 exposed through the first opening 32 among the pattern layers formed on the lower surface of the insulating layer 91-5 is referred to as a first ground pattern, and the cover layer 81b in which the first opening 32 is formed is referred to as a "first cover layer" for convenience of description.

The first substrate 801 or the first region 801 of the substrate 800 includes a first insulating layer 91-5. The first insulating layer 91-5 may mean an insulating layer disposed on a lowermost side among a plurality of insulating layers constituting the first substrate 801 or the first region 801 of the substrate 800.

The first substrate 801 or the first region 801 of the substrate 800 may include a first ground pattern 82-6 disposed on a lower surface of the first insulating layer 91-5. The first ground pattern 82-6 may be formed of a plurality of layers. For example, the first ground pattern 82-6 may have a structure in which a copper metal layer, a nickel metal layer, a palladium metal layer, and a gold metal layer are sequentially stacked, but is not limited thereto.

A first cover layer 81b may be formed on a lower surface of the first insulating layer 91-5 of the first substrate 801 or the first region 801 of the substrate 800. The first cover layer 81b may be disposed on a lower surface of the first insulating layer 91-5 while covering at least a portion of the first ground pattern 82-6. In addition, the first cover layer 81b may include a first opening 32 exposing at least a portion of a lower surface of the first ground pattern 82-6. In this case, the first opening 32 may be substantially referred to as an opening.

The first opening 32 of the first cover layer 81b includes a plurality of openings partially exposing the lower surface of the first ground pattern 82-6. That is, the first opening 32 of the first cover layer 81b may include a plurality of openings having a first width W1 and spaced apart from each other by a first distance D1. In this case, the first width W1 may be 0.1 mm to 0.5 mm, but is not limited thereto. When the first width W1 is smaller than 0.1 mm, an overlapping area between the first ground pattern 82-6, the first adhesive member 83-1, and the first reinforcing plate 85-1 is reduced, so the effect of blocking EMI and improving RF sensitivity may be insufficient. In addition, when the first width W1 is greater than 0.5 mm, an open area of the first ground pattern 82-6 increases, and accordingly, the adhesive strength of the first adhesive member 83-1 may decrease by reducing an contact area between the first adhesive member 83-1 and the first cover layer 81b.

Meanwhile, a first distance D1 between centers of each of the plurality of openings constituting the first opening 32 of the first cover layer 81b may be 0.8 mm to 1.2 mm. In addition, when the first distance D1 is smaller than the above range, it may have insufficient EMI blocking and RF sensitivity improvement effects corresponding to the decrease in the first width W1. In addition, when the first distance D1 is greater than the above range, it may have insufficient EMI blocking and RF sensitivity improvement effects corresponding to the decrease in the first width W1.

Meanwhile, the plurality of openings constituting the first opening 32 may have a circular shape, but is not limited thereto. For example, the plurality of openings may have any one of a rectangular shape, an elliptical shape, and a triangular shape.

That is, the first opening 32 of the embodiment does not include one large-area opening that entirely opens the first ground pattern 82-6 disposed on the lower surface of the first insulating layer 91-5, and the first opening 32 of the embodiment may include a plurality of small-area openings for partially exposing the first ground pattern 82-6. In addition, each of the plurality of openings of the small-area may be spaced apart from each other with a spacing in a range of 0.8 mm to 1.2 mm, and may have a width in a range of 0.1 mm to 0.5 mm.

Accordingly, an area of the first ground pattern 82-6 in the embodiment may be greater than that of the first opening 32. In other words, the first ground pattern 82-6 includes a portion covered through the first cover layer 81b and a portion exposed through the first opening 32. In addition, an area of a portion covered through the first cover layer 81b may be greater than an area of a portion exposed through the first opening 32.

A first adhesive member 83-1 is disposed under the lower surface of the first cover layer 81b. The first adhesive member 83-1 may be disposed under the lower surface of the first cover layer 81b while filling the first opening 32 formed in the first cover layer 81b.

Accordingly, the first adhesive member 83-1 may include a first portion disposed under the lower surface of the first cover layer 81b and a second portion disposed in the first opening 32. For example, the first adhesive member 83-1 may include a first portion disposed under the lower surface of the first cover layer 81b, and a second portion disposed under a lower surface of the first ground pattern 82-6 exposed through the first opening 32.

In this case, a thickness of the first portion of the first adhesive member 83-1 may be different from a thickness of the second portion. For example, a thickness of the first portion of the first adhesive member 83-1 may be smaller than a thickness of the second portion. For example, a thickness of the second portion of the first adhesive member 83-1 may correspond to a sum of a depth of the first opening 32 and a thickness of the first portion.

Accordingly, the upper surface of the first portion of the first adhesive member 83-1 is in contact with the lower surface of the first cover layer 81b, and the upper surface of the second portion of the first adhesive member 83-1 is in contact with the lower surface of the ground pattern 82-6. In this case, an area of the first portion of the first adhesive member 83-1 may be greater than an area of the second portion of the first adhesive member 83-1. In other words, an area of a region in contact with the first cover layer 81b among an entire region of the upper surface of the first adhesive member 83-1 may be greater than an area in contact with the first ground pattern 82-6. Accordingly, the embodiment may improve the adhesive strength of the first adhesive member 83-1.

Specifically, the first adhesive member 83-1 may be PSA (CBF-800). In addition, the first adhesive member 83-1 has a first adhesive strength when in contact with the first cover layer 81b. In addition, the first adhesive member 83-1 has a second adhesive strength when in contact with the first ground pattern 82-6. In this case, the first adhesive strength is greater than the second adhesive strength. In other words, the first adhesive member 83-1 may have greater adhesive strength when in contact with the first cover layer 81b compared to when in contact with the first ground pattern 82-6. For example, the adhesive strength when the first adhesive member 83-1 having the first area is adhered to the first cover layer 81b appears greater than the adhesive strength when adhering to the first ground pattern 82-6.

That is, the adhesive strength between the first adhesive member 83-1, the first cover layer 81b, and the second ground pattern 82-6 is shown in Table 1 below.

TABLE 1

| 170° C. 30 kgF/cm2, 60 min | | Adhesive member | |
|---|---|---|---|
| | Peel Strength | before reflow | after reflow |
| kgF/cm | Cover layer | 1.1 | 1.12 |
| | Ground pattern | 0.93 | 0.8 |

That is, referring to Table 1, the first adhesive member 83-1 and the first cover layer 81b had a peel strength of 1.1 kgF/cm before reflow and a peel strength of 1.12 kgF/cm after reflow. In contrast, the first adhesive member 83-1 and the first ground pattern 82-6 have a peel strength of 0.93 kgF/cm, and a peel strength of 0.8 kgF/cm after reflow. Accordingly, the embodiment allows the first opening 32 of the first cover layer 81b to have a partially open shape rather than a shape that completely opens the first ground pattern 82-6, and the first adhesive member 83-1 may make more contact with the first cover layer 81b compared to the first ground pattern 82-6, so that it can improve adhesive strength to the first adhesive member 83-1. A first reinforcing plate 85-1 may be disposed on the lower surface of the first adhesive member 83-1. The first reinforcing plate 85-1 may be connected to the first ground pattern 82-6 through the first adhesive member 83-1. That is, the first adhesive member 83-1 is disposed within the first opening 32 of the first cover layer 81b, and thus may directly contact the first ground pattern 82-6. In addition, the upper surface of the second portion of the first adhesive member 83-1 directly contacts the first ground pattern 82-6, and the lower surface is in direct contact with the first reinforcing plate 85-1, and accordingly it can connect the first reinforcing plate 85-1 and the first ground pattern 82-6 to each other.

In this case, the first reinforcing plate 85-1 is pressed while being disposed on the lower surface of the first adhesive member 83-1, and accordingly, may be attached to the lower surface of the first region 801 of the substrate 800 as the reflow of the first adhesive member 83-1 proceeds.

Here, when the pressing is performed, bending of the substrate 800 may occur according to a shape of the first opening 32 of the first cover layer 81b.

That is, when the first reinforcing plate 85-1a is pressed when the first opening 32 has one large-area opening that entirely exposes the first ground pattern 82-6a, pressing may be performed only at a portion where the first opening 32 is formed among the entire regions of the first region 801a of the substrate, that is, a portion where the first adhesive member is formed as in FIG. 4. Accordingly, bending in which the heights of the first region 801a of the substrate 800 are different between the portion where the first opening 32 is formed and other portions may occur. In addition, the occurrence of bending of the first region 801a causes a flatness problem of the image sensor disposed on the first region 801a of the substrate 800, and thus reliability may be deteriorated.

In contrast, the embodiment allows the first opening 32 to have a plurality of small-area openings partially exposing the first ground pattern 82-6, so that the entire region of the first region 801 of the first substrate 800 is pressed when the first reinforcing plate 85-1 is pressed, and so that bending of the substrate 800 can be minimized. In addition, the embodiment can maintain the flatness of the image sensor disposed on the substrate 800 by minimizing bending of the substrate 800, thereby improving reliability.

Meanwhile, a method of manufacturing the substrate, a process of coupling the first adhesive member, and a process of coupling the first reinforcing plate are as follows.

Figure 5A:
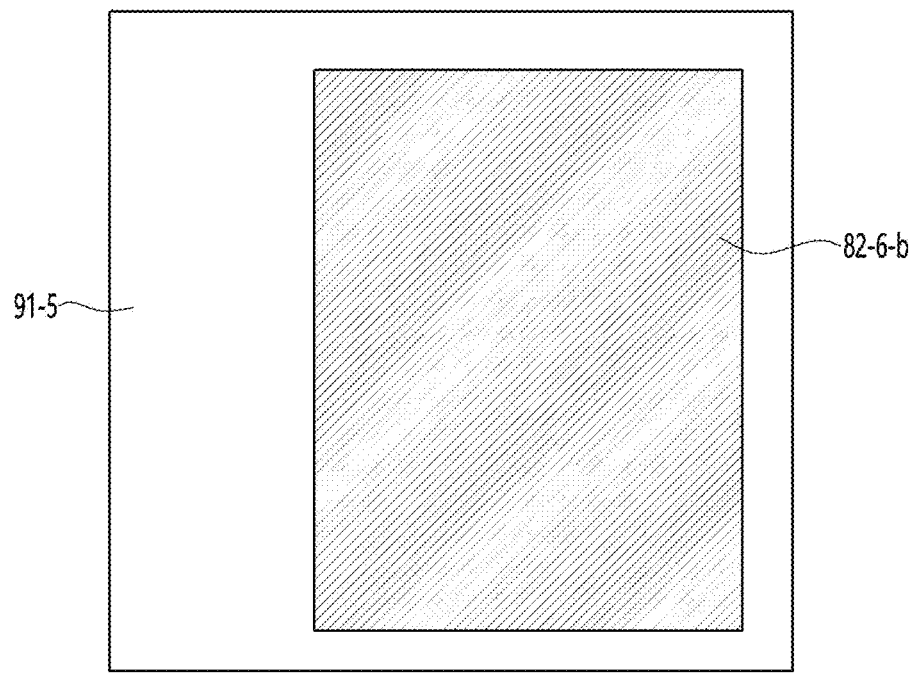
FIGS. 5A to 5D are views illustrating a process of coupling a first adhesive member and a first reinforcing plate to a first substrate or a first region of a substrate according to an embodiment.

As shown in FIG. 5A, the embodiment may preferentially manufacture a substrate. For example, the embodiment may form the first ground pattern 82-6 by sequentially laminating a copper metal layer, a nickel metal layer, a palladium metal layer, and a gold metal layer on one surface of the first insulating layer 91-5. In this case, a layer structure of the metal layer forming the first ground pattern 82-6 is not limited thereto. For example, the first ground pattern 82-6 may be formed of a single layer. In addition, the first ground pattern 82-6 may be composed of a plurality of layers, but a type of metal material constituting each of these layers may be changed.

Figure 5B:
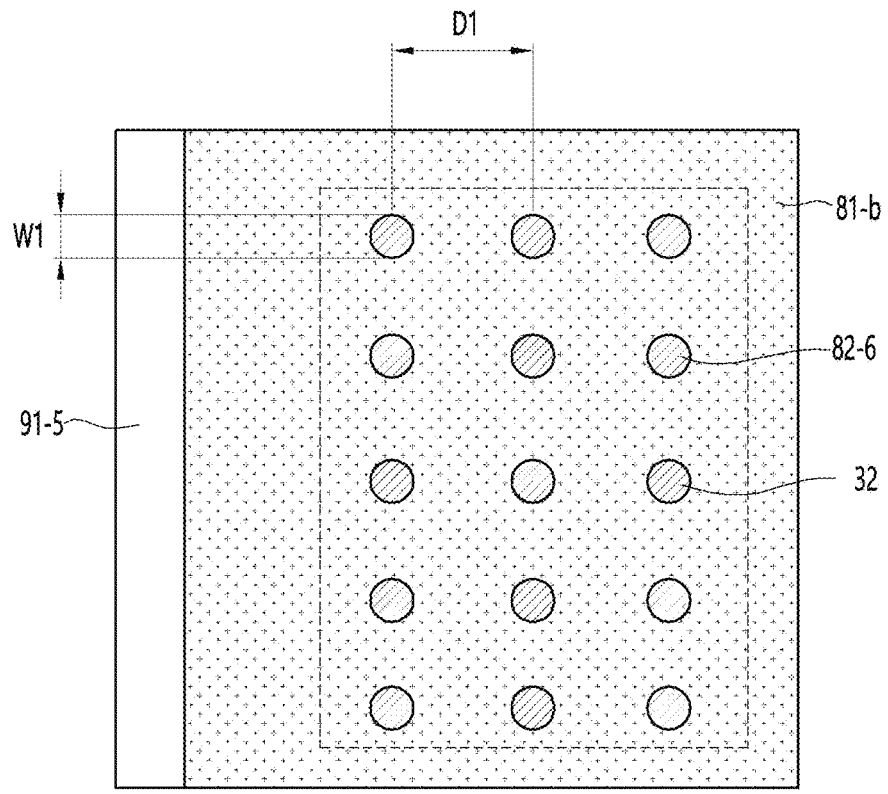

Next, the embodiment proceeds with a process of laminating the first cover layer 81b on the first insulating layer 91-5 and the first ground pattern 82-6 as described above and may manufacture the first region 801 of the substrate 800 as shown in FIG. 5B. In this case, the first cover layer 81b includes a first opening 32 having a plurality of openings that partially expose the first ground pattern 82-6 without exposing the entirety thereof.

That is, the first opening 32 of the first cover layer 81b includes a plurality of openings partially exposing a lower surface of the first ground pattern 82-6. That is, the first opening 32 of the first cover layer 81b may have a first width W1 and may include a plurality of openings in which centers thereof are spaced apart by a first distance D1. In this case, the first width W1 may be 0.1 mm to 0.5 mm, but is not limited thereto. When the first width W1 is smaller than 0.1 mm, an overlapping area between the first ground pattern 82-6, the first adhesive member 83-1, and the first reinforcing plate 85-1 is reduced, so the effect of blocking EMI and improving RF sensitivity may be insufficient. In addition, when the first width W1 is greater than 0.5 mm, an open area of the first ground pattern 82-6 increases, and accordingly, the adhesive strength of the first adhesive member 83-1 may decrease by reducing an contact area between the first adhesive member 83-1 and the first cover layer 81b.

Meanwhile, a first distance D1 between centers of each of the plurality of openings constituting the first opening 32 of the first cover layer 81b may be 0.8 mm to 1.2 mm. In addition, when the first distance D1 is smaller than the above range, it may have insufficient EMI blocking and RF sensitivity improvement effects corresponding to the decrease in the first width W1. In addition, when the first distance D1 is greater than the above range, it may have insufficient EMI blocking and RF sensitivity improvement effects corresponding to the decrease in the first width W1.

Meanwhile, the plurality of openings constituting the first opening 32 may have a circular shape, but is not limited thereto. For example, the plurality of openings may have any one of a rectangular shape, an elliptical shape, and a triangular shape.

Figure 5C:
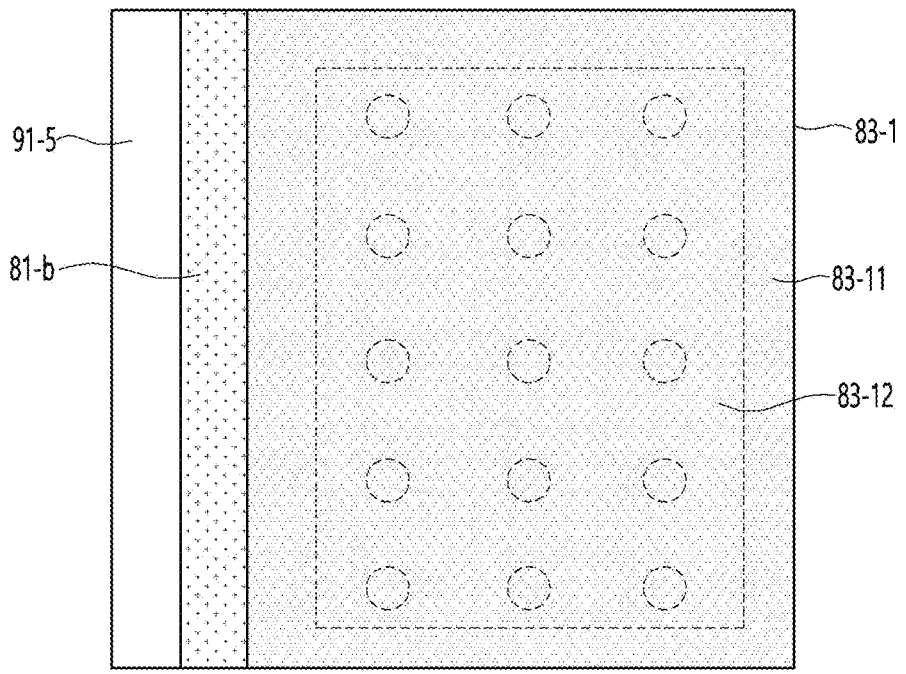

Next, the embodiment may proceed with a process of disposing a first adhesive member 83-1 on the first cover layer 81b as shown in FIG. 5C. In this case, the first adhesive member 83-1 may also be disposed in the first opening 32 of the first cover layer 81b. Accordingly, the first adhesive member 83-1 may include a first portion disposed under the lower surface of the first cover layer 81b and a second portion disposed in the first opening 32. In this case, a thickness of the first portion of the first adhesive member 83-1 may be different from a thickness of the second portion. For example, a thickness of the first portion of the first adhesive member 83-1 may be smaller than a thickness of the second portion. For example, a thickness of the second portion of the first adhesive member 83-1 may correspond to a sum of a depth of the first opening 32 and a thickness of the first portion.

Accordingly, the upper surface of the first portion of the first adhesive member 83-1 is in contact with the lower surface of the first cover layer 81b, and the upper surface of the second portion of the first adhesive member 83-1 is in contact with the lower surface of the ground pattern 82-6. In this case, an area of the first portion of the first adhesive member 83-1 may be greater than an area of the second portion of the first adhesive member 83-1. In other words, an area of a region in contact with the first cover layer 81b among an entire region of the upper surface of the first adhesive member 83-1 may be greater than an area in contact with the first ground pattern 82-6. Accordingly, the embodiment may improve the adhesive strength of the first adhesive member 83-1.

Figure 5D:
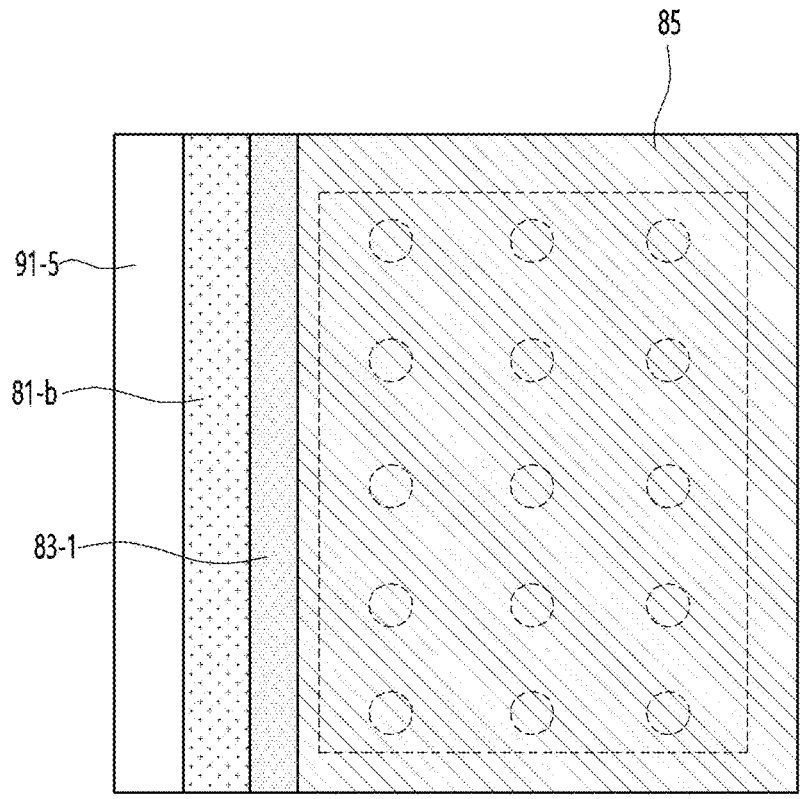

Next, the embodiment presses while the first reinforcing plate 85-1 is placed on the first adhesive member 83-1, and may proceed with a process of attaching the first reinforcing plate 85-1 to the lower surface of the first region 801 of the substrate 800 by reflowing the first adhesive member 83-1 after pressing as shown in FIG. 5D.

Hereinafter, it will be described an arrangement structure of the noise shielding unit, the second adhesive member and the second reinforcing plate disposed in the second region 802 of the substrate 800 and their coupling process.

Figure 7:
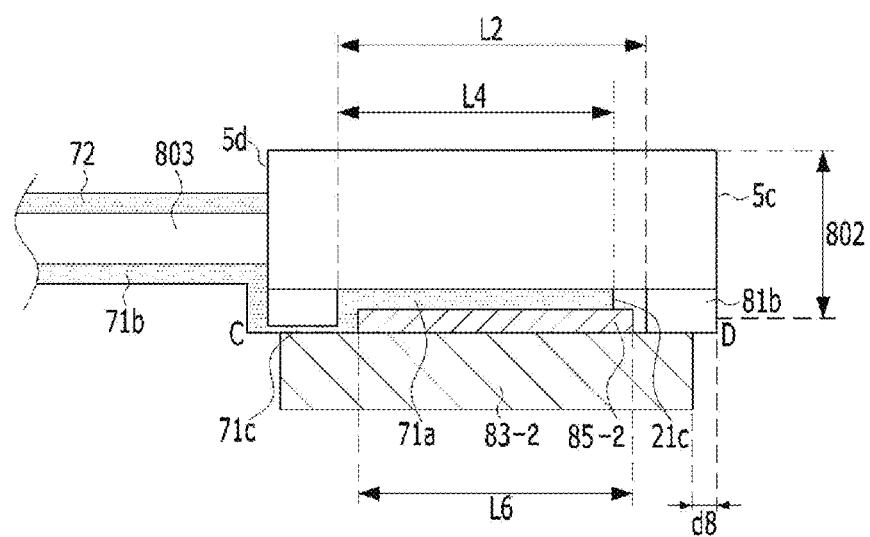
FIG. 7 is a cross-sectional view of a second region of a substrate in a second direction according to an embodiment.

FIG. 6 is a cross-sectional view of a second region of a substrate in a first direction according to an embodiment, FIG. 7 is a cross-sectional view of a second region of a substrate in a second direction according to an embodiment, and FIGS. 8A to 8D show a process of coupling a noise shielding unit, a second adhesive member, and a second reinforcing plate to a substrate.

Figure 8A:
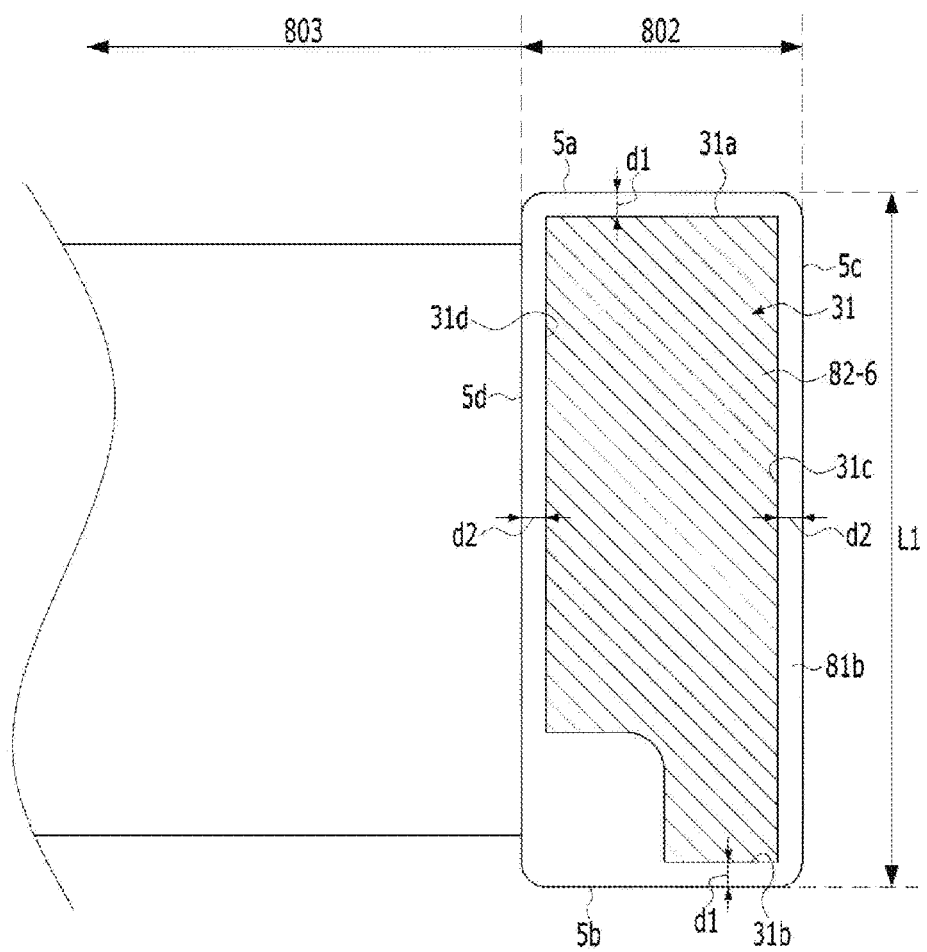
Figure 8B:
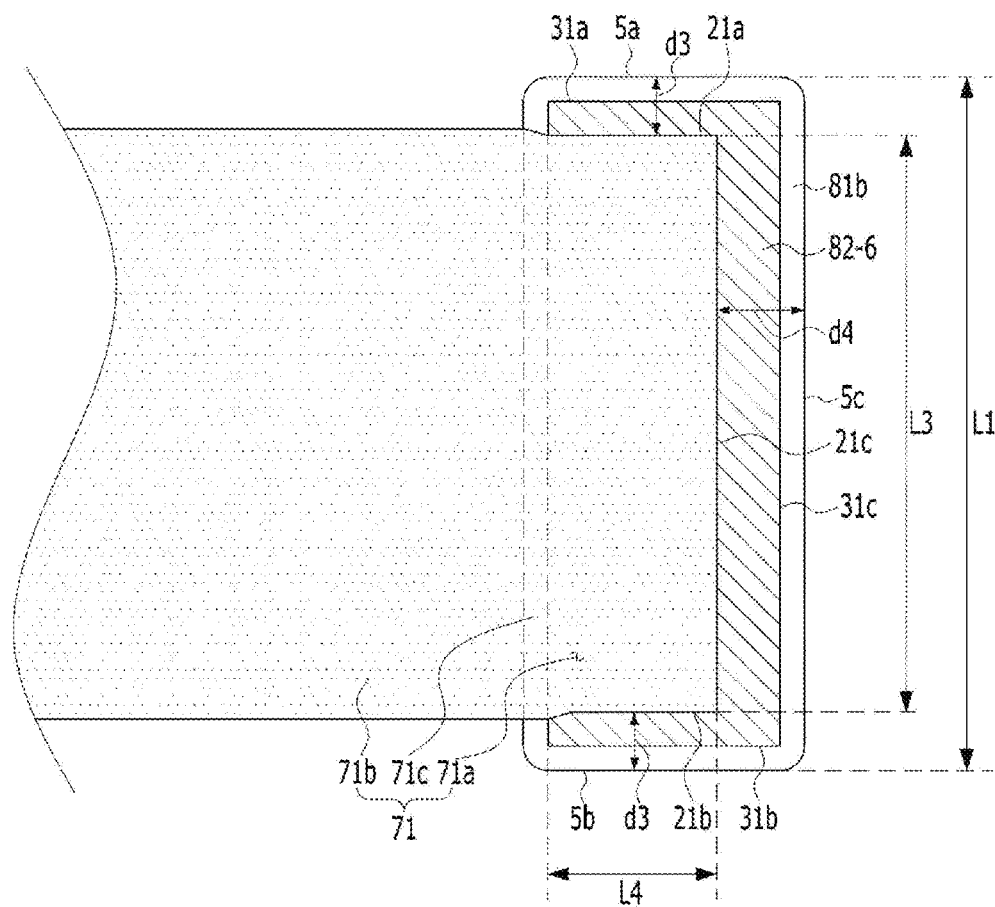
Figure 8D:
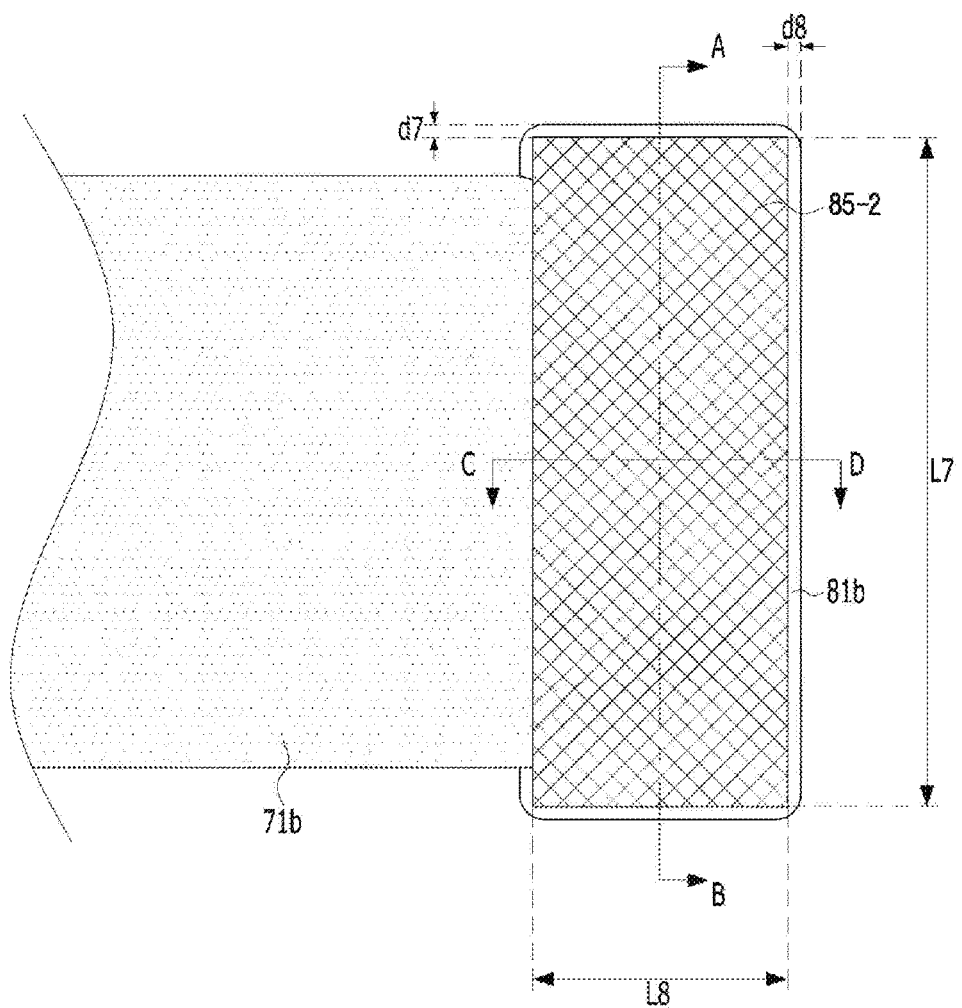

Specifically, FIG. 6 is a cross-sectional view in a AB direction of FIG. 8D, and FIG. 7 is a cross-sectional view in a CD direction of FIG. 8D. For example, FIGS. 8A to 8D show bottom views of a second region 802 and a third region 803 of a substrate 800, and FIGS. 6 and 7 may be a cross-sectional view of FIG. 8D rotated 180 degrees.

Referring to FIG. 8A, the embodiment forms the second opening 31 exposing the pattern layer 82-6 (or ground pattern) from the second surface of the second region 802 of the substrate 800. As previously described, the pattern layer 82-6 may be referred to as a "second ground layer".

In this case, a shape of the second ground pattern exposed through the second opening 31 is not limited to the shape shown in FIG. 8A (eg, '¬' shape), and may be of various polygonal shapes (eg, square, triangular, etc.) or circular.

In FIG. 8A, there is a region that is not exposed by the second opening 31 in a lower left portion, and this may form another ground pattern (eg, "analog ground pattern") that is separated or spaced apart from the second ground pattern (or "digital ground pattern") exposed through the second opening 31.

In another embodiment, an analog ground pattern may also be exposed through the second opening 31, and a first noise shielding unit 71 and a second adhesive member 83-2 may be disposed between the exposed analog ground pattern and the second reinforcing plate 85-2.

For example, a portion of the cover layer 81b of the second region 802 of the substrate 800 may be removed to form the second opening 31 exposing the lower surface of the pattern layer 82-6. In this case, the cover layer 81b of the second region 802 will be described as a "second cover layer" in order to be distinguished from the cover layer of the first region 801 of the substrate 800.

The second region 802 of the substrate 800 may have four outer surfaces 5a to 5d.

For example, a plan view of the second region 802 of the substrate 800 may have a quadrangular shape having four sides 5a to 5d. A separation distances d1 and d2 from the outer surfaces 5a to 5d (or sides) of the second opening 31 to the second opening 31 may range from 0.3 [mm] to 0.5 [mm].

A depth H of the second opening 31 may be the same as a thickness of the second cover layer 81b of the substrate 800. For example, the depth H of the second opening 31 may be a distance of the lens of the lens driving unit 100 or the lens barrel 400 in the optical axis direction. For example, the depth H may range from 21 μm to 24 μm. For example, the depth H may be 23 μm.

Next, referring to FIG. 8B, a portion 71a of the first noise shielding unit 71 is disposed in the second opening 31 of the second region 802 of the substrate 800.

The first noise shielding unit 71 may include a first portion 71a disposed in the second opening 31 of the second region 802 of the substrate 800, and a second portion 71b disposed under the third region 803 of the substrate 800. In addition, the first noise shielding unit 71 may include a third portion connecting the first portion and the second portion.

For example, the second portion 71b of the first noise shielding unit 71 may be disposed on a connection substrate 803, and an end of the first portion 71a may be disposed in the second opening 31 of the second substrate 802. For example, a portion of an end of the first portion 71a may be disposed in the second opening 31.

The first portion 71a of the first noise shielding unit 71 may be disposed below the second ground pattern 82-6 of the second region 802 of the substrate 800 exposed by the second opening 31.

The second opening 31 of the substrate 800 may include inner surfaces 31a to 31d and a lower surface. Here, the "inner surface" of the second opening 31 may be expressed as "side wall", "side surface", or "inner side wall". For example, a first inner surface 31a and a second inner surface 31b may face each other, and a third inner surface 31c and a fourth inner surface 31d may face each other. The third inner surface 31c may connect one end of the first inner surface 31a and one end of the second inner surface 31b, and the fourth inner surface 31d may connect the other end of the first inner surface 31a and the other end of the second inner surface 31b.

A lower surface of the second opening 31 may be one surface (eg, the lower surface) of the exposed second ground pattern 82-6 of the second region 802 of the substrate 800. A lower surface of the first portion 71a of the first noise shielding unit 71 may contact a lower surface of the second opening 31.

For example, the first portion 71a of the first noise shielding unit 71 may include a first surface 21a (or "first side surface") facing the first inner surface 31a of the second opening 31, a second surface 21b (or "second side surface") facing the second inner surface 31b of the second opening 31, and a third surface 21c (or "third side surface") facing the third inner surface 31c of the second opening 31.

A side surface of the first portion 71a of the first noise shielding unit 71 may be positioned in the second opening 31 of the second region 802 of the substrate 800, and may be spaced apart from the second surface 11b of the second region 802 of the substrate 800.

For example, the first surface 21a, the second surface 21b, and the third surface 21c of the first portion 71a of the first noise shielding unit 71 may be positioned within the second opening 31 of the second region 802 of the substrate 800 and may be spaced apart from the second surface 11b of the second region 802 of the substrate 800.

A length of the second portion 71b of the first noise shielding unit 71 in the vertical direction may be greater than a length L3 of the first portion 71a in the vertical direction. This is to improve the EMI shielding effect in the third region 803 of the substrate 800.

A length L3 (or width) of one side of the first noise shielding unit 71 is smaller than a length L1 (or width) of one side of the second opening 31 of the second substrate 802.

For example, a length of a first long side positioned on one side of the second opening 31 of the second substrate 802 may be greater than a length of a second long side positioned on the other side of the second opening 31. For example, the first long side and the second long side may face each other.

In addition, for example, a length of a first short side positioned on one side of the second opening 31 of the second substrate 802 may be greater than a length of a second short side positioned on the other side of the second opening 31. For example, the first short side and the second short side may face each other.

For example, a length L3 of a short side of the first noise shielding unit 71 is smaller than a length L1 of any one long side of the second opening 31 of the second substrate 802.

A length L3 of the first portion 71a of the first noise shielding unit 71 in the vertical direction is smaller than a length L1 of the second opening 31 of the substrate 800 in the vertical direction (L3<L1).

A length L4 of the first portion 71a of the first noise shielding unit 71 in a horizontal direction is smaller than a length L2 of the second opening 31 of the substrate 800 in the horizontal direction (L4<L2).

For example, the vertical direction may be a AB direction of FIG. 8D or a y-axis direction of FIG. 1 perpendicular to the optical axis direction of the lens driving unit 100. Alternatively, the vertical direction is perpendicular to the optical axis direction of the lens driving unit 100 (or an axis of the image sensor 810) and may be a direction from a first outer surface 5a of the second region 802 of the substrate 800 to a second outer surface 5b.

Alternatively, for example, the vertical direction may be a direction perpendicular to a direction from the image sensor 810 toward the connector 840.

In addition, for example, the horizontal direction may be a CD direction of FIG. 8D or a x-axis direction of FIG. 1 perpendicular to the optical axis direction of the lens driving unit 100.

Alternatively, for example, the vertical direction may be a direction from the first inner surface 31a of the second opening 31 of the substrate 800 to the second inner surface 31b, and the horizontal direction 800 may be a direction from a third inner surface 31c of the second opening 31 of the substrate 800 to a fourth inner surface 31d.

For example, an area of the lower surface (or upper surface) of the first portion 71a of the first noise shielding unit 71 disposed within the second opening 31 of the substrate 800 may be smaller than an area of a lower surface of the second opening 31 of the substrate 800 (or an area of a lower surface of the exposed pattern layer 82-6).

A separation distance d3 between the first surface 21a of the first portion 71a of the first noise shielding unit 71 and the first outer surface 5a of the second region 802 of the substrate 800 and a separation distance d3 between the second surface 21b of the first portion 71a of the first noise shielding unit 71 and the second outer surface 5b of the second region 802 of the substrate 800 may be greater than d1 (d3>d1).

A separation distance d4 between the third surface 21c of the first portion 71a of the first noise shielding unit 71 and the third outer surface 5c of the second region 802 of the substrate 800 may be greater than d2 (d4>d2). Since d3>d1, d4>d2, the first portion 71a of the first noise shielding unit 71 may be disposed in the second opening 31.

In FIG. 8B, d4 may be greater than d3 (d4>d3). For example, d3 may be 0.6 mm to 0.8 mm, and d4 may be 0.9 mm to 1.1 mm. In another embodiment, d4=d3 or d4<d3.

Referring to FIG. 6, the first to third surfaces 21a to 21c of the first portion 71a of the first noise shielding unit 71 may be spaced apart from the first to third inner surfaces 31a to 31c of the second opening 31 of the substrate 800. For example, the first surface 21a is spaced apart from the first inner surface 31a of the second opening 31, the second surface 21b is spaced apart from the second inner surface 31b of the second opening 31, and the third surface 21c may be spaced apart from the third inner surface 31c of the second opening 31.

A separation distance between the third surface 21c of the first noise shielding unit 71 and the third inner surface 31c of the second opening 31 may be different from a separation distance between the first surface 21a of the first noise shielding unit 71 and the first inner surface 31a of the second opening 31 or/and a separation distance between the second surface 21b of the first noise shielding unit 71 and the second inner surface 31b of the second opening 31.

For example, a separation distance between the third surface 21c of the first noise shielding unit 71 and the third inner surface 31c of the second opening 31 may be greater than a separation distance between the first surface 21a and the first inner surface 31a of the second opening 31 or/and the separation distance between the second surface 21b and the second inner surface 31b of the second opening 31.

For example, a separation distance between the inner surfaces 31a to 31d of the second opening 31 and an end (eg, 21a to 21c) of the first noise shielding unit 71 may be greater than a separation distance between the inner surfaces 31a to 31d of the second opening 31 and an end of the second adhesive member 83-2. This is to improve adhesion between the second reinforcing plate 85-2 and the second substrate 802 by increasing the area of the second adhesive member 83-2.

For example, a horizontal (or vertical) separation distance between the inner surfaces 31a to 31d of the second opening 31 and an end of the second reinforcing plate 85-2 may be greater than a horizontal (or vertical) separation distance between the inner surfaces 31a to 31d of the second opening 31 and an end (eg, 21a to 21c) of the first noise shielding unit 71. But, it is not limited thereto, and the former may be equal to or smaller than the latter in other embodiments.

For example, a horizontal (or vertical) separation distance between the inner surfaces 31a to 31d of the second opening 31 and an end of the second reinforcing plate 85-2 may be greater than a horizontal (or vertical) separation distance between the inner surfaces 31a to 31d of the second opening 31 and the end of the second adhesive member 83-2. However, it is not limited thereto, and the former may be equal to or smaller than the latter in other embodiments.

Referring to FIGS. 8C and 8D, it attaches or fixes the second reinforcing plate 85-2 on the first portion 71a of the first noise shielding unit 71 disposed in the second opening 31 by the second adhesive member 83-2.

For example, it may be fixed or attached by pressing the second reinforcing plate 85-2 on which the second adhesive member 83-2 is formed to the first portion 71a of the first noise shielding unit 71 by the heat press performed after coating or forming the second adhesive member 83-2 on one surface (eg, upper surface) of the second reinforcing plate 85-2. The upper surface of the second reinforcing plate 85-2 may contact the second surface 11b (or lower surface) of the second region 802 of the substrate 800 by the pressing.

The second adhesive member 83-2 may be a conductive adhesive member or may include a conductive adhesive member (eg, a conductive particle). For example, the second adhesive member 83-2 may be FGBF-700. A side surface of the second adhesive member 83-2 may be spaced apart from the second surface 11b of the second region 802 of the substrate 800.

A length L5 of the second adhesive member 83-2 in the vertical direction is smaller than a length L1 of the second opening 31 of the substrate 800 in the vertical direction (L5<L1). A length L6 of the second adhesive member 83-2 in the horizontal direction is smaller than a length L2 of the second opening 31 of the substrate 800 in the horizontal direction (L6<L2).

In addition, a length L5 of the second adhesive member 83-2 in the vertical direction may be greater than or equal to a length L3 of the first portion 71a of the first noise shielding unit 71 in the vertical direction.

A length L6 of the second adhesive member 83-2 in the horizontal direction may be greater than or equal to a length L4 of the first portion 71a of the first noise shielding unit 71 in the horizontal direction.

A separation distance d5 between the first side surface of the second adhesive member 83-2 and the first outer surface 5a of the second region 802 of the substrate 800 and the separation distance d5 between the second side surface of the second adhesive member 83-2 and the second outer surface 5b of the second region 802 of the substrate 800 may be greater than d1 (d5>d1). In another embodiment, d5=d1 may be satisfied.

A separation distance d6 between the third side surface of the second adhesive member 83-2 and the third outer surface 5c of the second region 802 of the substrate 800 may be greater than d2 (d6>d2). In another embodiment, d6=d2 may be satisfied. For example, each of d5 and d6 may be 0.5 [mm] to 0.6 [mm]. d1:d3 may be 1:1.2 to 1:2.65, and d2:d4 may be 1:1.8 to 1:3.65. In addition, d1:d5 may be 1:1 to 1:2, and d2:d6 may be 1:1 to 1:2. When d3/d1 is less than 1.2, a difference between the length of the first portion 71a of the first noise shielding unit 71 in the horizontal direction and the length of the second opening 31 in the horizontal direction is very small, and accordingly, a process margin for disposing the first portion 71a of the first noise shielding unit 71 is insufficient, the first noise shielding unit 71 may be separated out of the second opening 31, and as a result, a resistance value between the second reinforcing plate 85-2 and the ground of the substrate 800 may increase to 1 ohm or more.

When d3/d1 is greater than 2.65, an area of the first portion 71a of the first noise shielding unit 71 may be reduced so that the performance of blocking noise emitted from the camera module may be weakened, and accordingly, it may deteriorate the RF sensitivity of the optical device to which the camera module is mounted.

When d5/d1 or/and d6/d2 are less than 1, a length of the second adhesive member 83-2 in the horizontal direction is greater than the length of the second opening 31 in the horizontal direction so that the second adhesive member 83-2 can be disposed on the lower surface of the second region 802 of the substrate 800 outside the second opening 31, and it may increase the resistance value between the second reinforcing plate 85-2 and the ground of the substrate 800 to 1 ohm or more.

When d5/d1 or/and d6/d2 are greater than 2, an area of the second adhesive member 83-2 is reduced so that the adhesive force between the second reinforcing plate 85-2 and the substrate 800 is reduced, and as a result, the second reinforcing plate 85-2 can be easily separated from the substrate 800.

Referring to FIG. 8D, a separation distance d7 between the first outer surface 5a (or the first-second outer surface 5b) of the second region 802 of the substrate 800 and the first side surface (or second side surface) of the second reinforcing plate 85-2 may be smaller than d1 (d7<d1). In addition, a separation distance d8 between the third outer surface 5c of the second region 802 of the substrate 800 and the third side surface of the second reinforcing plate 85-2 may be smaller than d2 (d8<d2). For example, the above-described d1 to d8 may be a shortest distance between two faces parallel to target two faces.

A thickness (T1, eg, a thickness of the first portion 71a) of the first noise shielding unit 71 may be smaller than a depth H of the second opening 31 of the substrate 800 (T1<H). Here, a thickness of the first noise shielding unit 71 may be a length of the first noise shielding unit 71 in the optical axis direction.

For example, a thickness of the first noise shielding unit 71 (T1, a thickness of the first portion 71a) may be 12 [μm] to 18 [μm].

A side surface of the first portion 71a of the noise shielding unit 71 may be positioned farther than inner surfaces 31a to 31d of the second opening 31 based on the outer surfaces 5a to 5c of the second region 802 of the substrate 800.

A side surface of the second adhesive member 83-2 may be positioned farther than inner surfaces 31a to 31d of the second opening 31 based on the outer surfaces 5a to 5c of the second region 802 of the substrate 800.

In addition, the outer surface of the second reinforcing plate 85-2 may be positioned closer to the outer surfaces 5a to 5c of the second region 802 of the substrate 800 than to the sidewalls 31a to 31d of the second opening 31 of the substrate 300.

In addition, an area of the first portion 71a of the noise shielding unit 710 overlapping the second region 802 of the substrate 800 in the optical axis direction of the lens driving unit 100 may be smaller than an area of a lower surface of the second opening 31. In addition, an area of the second adhesive member 83-2 overlapping the second region 802 of the substrate 800 in the optical axis direction may be smaller than an area of a lower surface of the groove 310 of the substrate 800.

Meanwhile, each of the first adhesive member 83-1 and the second adhesive member 83-2 according to the embodiment may include conductive particles (not shown). Accordingly, the first reinforcing plate 85-1 in the embodiment may be electrically connected to the first ground pattern 82-6 through the first adhesive member 83-1. In addition, the second reinforcing plate 85-2 may be electrically connected to the second ground pattern 82-6 and the noise shielding unit 710 through the second adhesive member 83-2.

A thickness T3 of the second reinforcing plate 85-2 may be less than a total thickness of the substrate 800 and may be greater than a thickness of the flexible substrate 800-1 and a thickness of the second adhesive member 83-2. For example, the second reinforcing plate 85-2 may have a thickness of 90 μm to 120 μm.

A thickness T3 of the second reinforcing plate 85-2 may be greater than a thickness T1 of the first noise shielding unit 71 and a thickness T2 of the second adhesive member 83-2 (T3>T1, T2).

Referring to FIGS. 6 and 7, an upper surface of the second reinforcing plate 85-2 may contact the second surface 11b (or lower surface) of the second region 802 of the substrate 800. For example, the upper surface of an edge of the second reinforcing plate 85-2 may be in contact with the second surface 11b (or lower surface) of the second region 802 of the substrate 800.

In another embodiment, an upper surface of an edge of the second reinforcing plate 85-2 may be spaced apart from the second surface 11b of the second region 802 of the substrate 800.

The embodiment may allow the first noise shielding unit 71 to be disposed between the pattern layer 82-6 opened by the second opening 31 of the second region 802 of the substrate 800 and the second reinforcing plate 85-2, and accordingly, it may shield or reduce EMI noise emitted from the camera module 200. At the same time, the first noise shielding unit 71 and the second adhesive member 83-2 are disposed in the second opening 31, and accordingly, it is possible to have a structure in which the first noise shielding unit 71 and the second adhesive member 83-2 adhere closely to the pattern layer 82-6 exposed by the second opening 31, and it reduces the electrical resistance between the pattern layer 82-6 of the substrate 800 used for ground and the second reinforcing plate 85-2, and accordingly, it may use the second reinforcing plate 85-2 as a ground for the substrate 800. That is, the embodiment may allow the electrical resistance value between the pattern layer 82-6 of the substrate 800 and the second reinforcing plate 85-2 to have less than 1 ohm.

A camera module according to another embodiment may further include a noise shielding unit disposed on at least one of the first surface 11a and the second surface 11b of the first region 801 of the substrate 800 or the first surface 11a of the second region 802.

Figure 9:
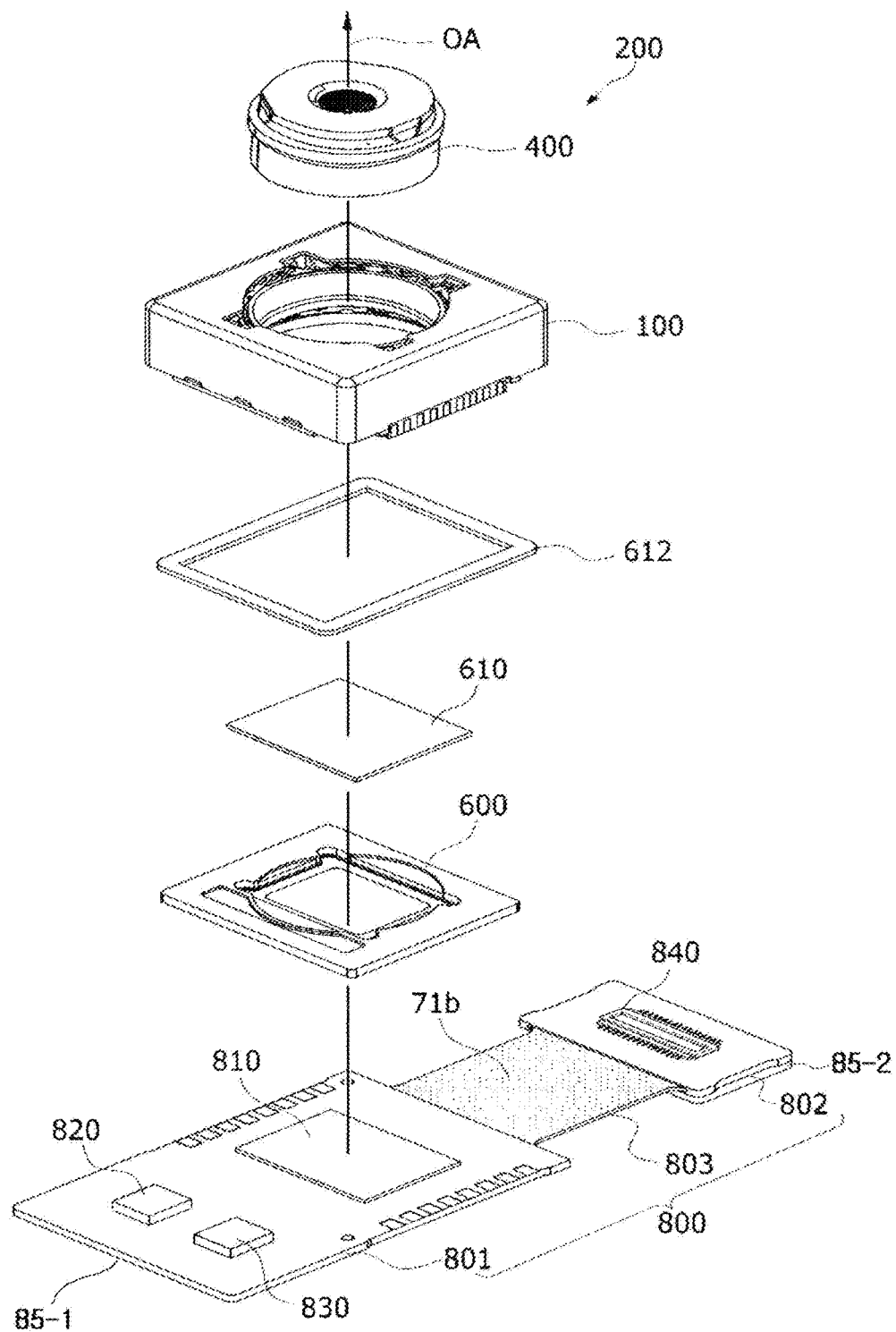
FIG. 9 is a perspective view of a camera module according to another embodiment.

FIG. 9 is a perspective view of a camera module according to another embodiment.

Referring to FIG. 9, a camera module 200 includes a lens or lens barrel 400, a lens driving unit 100, an adhesive member 612, a filter 610, a holder 600, a substrate 800, an image sensor 810, a motion sensor 820, a controller 830, a connector 840, a noise shielding unit 70, a first adhesive member (not shown), a second adhesive member (not shown), a first reinforcing plate 85-1 and a second reinforcing plate 85-2. The same reference numerals as those in FIG. 1 denote the same configurations, and descriptions of the same configurations are omitted or simplified.

The description of the noise shielding unit 70 described in FIG. 1 may be equally applicable to the description of the noise shielding unit 70 of FIG. 9, the description of the first adhesive member 83-1 and the second adhesive member 83-2 of FIG. 1 may be equally applicable to the description of the first and second adhesive members (not shown) of FIGS. 8A-8D, and the description of the reinforcing plate of FIG. 1 may be equally applied to the first reinforcing plate 85-1 and the second reinforcing plate 85-2 of FIG. 9.

A lens or lens barrel 400 may be mounted on the lens driving unit 100.

The lens driving unit 100 may be expressed as a "sensing unit", a "photographing unit", a "Voice Coil Motor (VCM)", or a "lens driving device".

For example, the lens driving unit 100 may be a lens driving unit for AF or a lens driving unit for OIS. Here, "the lens driving unit for AF is capable of performing only an auto focus function, and the lens driving unit for OIS is capable of performing an auto focus function and an OIS (Optical Image Stabilizer) function.

For example, the lens driving device 100 may be a lens driving device for AF. The lens driving device for AF includes a housing, a bobbin disposed inside the housing, a coil disposed on the bobbin, a magnet disposed on the housing, at least one elastic member coupled to the bobbin and the housing, and a base disposed below the bobbin (or/and the housing). For example, the elastic member may include the above-described upper elastic member and lower elastic member.

A driving signal (eg, driving current) may be provided to the coil, and the bobbin may be moved in an optical axis direction by electromagnetic force generated by an interaction between the coil and the magnet. In another embodiment, the coil may be disposed on the housing and the magnet may be disposed on the bobbin.

In addition, the lens drive unit for AF may further include a sensing magnet disposed on the bobbin, an AF position sensor disposed in the housing (e.g., a hall sensor), and a circuit board on which the AF position sensor is disposed and which is disposed or mounted on the housing and/or the base for driving AF feedback. In another embodiment, the AF position sensor may be disposed on the bobbin and the sensing magnet may be disposed on the housing.

The circuit board may be electrically connected to the coil and the AF position sensor, a driving signal may be provided to each of the coil and the AF position sensor through the circuit board, and an output of the AF position sensor may be transmitted to the circuit board.

A camera module according to another embodiment may include a housing coupled to the lens or lens barrel 400 instead of the lens driving device 100 of FIG. 1 and fixed to the lens or lens barrel 400, and the housing may be coupled or attached to the upper surface of a holder 600. The housing attached or fixed to the holder 600 may not be moved, and a position of the housing may be fixed while attached to the holder 600.

Alternatively, for example, the lens driving unit 100 may be a lens driving unit for OIS.

The lens driving unit for OIS may include a housing, a bobbin disposed within the housing and for mounting a lens or lens barrel 400, a first coil disposed on the bobbin, a magnet disposed in the housing and facing the first coil, at least one upper elastic member coupled to an upper portion of the bobbin and an upper portion of the housing, at least one lower elastic member coupled to a lower portion of the bobbin and a lower portion of the housing, a second coil disposed below the bobbin (or/and housing), a circuit board disposed below the second coil, and a base disposed below the circuit board.

In addition, the lens driving unit for OIS may further include a cover member coupled to the base and providing a space for accommodating elements of the lens driving unit together with the base.

In addition, the lens driving unit for OIS may further include a support member electrically connecting the circuit board and the upper elastic member and supporting the housing with respect to the base. Each of the first coil and the second coil may be electrically connected to the circuit board 250 and may receive a driving signal (driving current) from the circuit board.

For example, the upper elastic member may include a plurality of upper springs, the support member may include support members connected to the upper springs, and the first coil may be electrically connected to the circuit board through the upper springs and the support member. The circuit board may include a plurality of terminals, and a part of the plurality of terminals may be electrically connected to each of the first coil and/or the second coil.

The bobbin and the lens or lens barrel 400 coupled thereto can be moved in the optical axis direction by the electromagnetic force generated by the interaction between the first coil and the magnet, and as a result, the displacement of the bobbin in the optical axis direction is controlled so that AF driving may be implemented.

In addition, the housing may be moved in a direction perpendicular to the optical axis by the electromagnetic force due to the interaction between the second coil and the magnet, and thus, hand shake correction or OIS driving may be implemented.

In addition, the lens driving unit may further include a sensing magnet (not shown) disposed on the bobbin and an AF position sensor (eg, a hall sensor, not shown) disposed on the housing for AF feedback driving. In addition, the lens driving unit may further include a circuit board (not shown) disposed on the housing and/or the base and on which the AF position sensor is disposed or mounted. In another embodiment, the AF position sensor may be disposed on the bobbin, and the sensing magnet may be disposed on the housing. In addition, the lens driving unit may further include a balancing magnet disposed on the bobbin to correspond to the sensing magnet.

The AF position sensor may output an output signal according to a result of detecting a strength of a magnetic field of the sensing magnet according to a movement of the bobbin. The AF position sensor may be electrically connected to the circuit board through the upper elastic member (or lower elastic member) and/or the support member. The circuit board may provide a driving signal to the AF position sensor, and an output of the AF position sensor may be transmitted to the circuit board, and a controller 830 may sense or detect the displacement of the bobbin using the output of the AF position sensor.

The holder 600 may be disposed under the lens driving unit 100 (eg, abase). The filter 610 is mounted on the holder 600, and the holder 600 may have a protrusion 500 on which the filter 610 is seated.

The adhesive member 612 may couple or attach the lens driving unit 100 (eg, a base) to the holder 600. In addition to serving as an adhesive, the adhesive member 6120 may also serve to inhibit foreign substances from entering the lens driving unit 100.

For example, the adhesive member 612 may be a thermosetting adhesive member (eg, thermosetting epoxy) or an ultraviolet curable adhesive member (eg, ultraviolet curable epoxy).

The filter 610 may serve to block light of a specific frequency band from light passing through the lens barrel 400 from being incident to the image sensor 810. The filter 610 may be an infrared cut filter, but is not limited thereto. In this case, the filter 610 may be disposed parallel to a x-y plane.

An opening may be formed at a portion of the holder 600 where the filter 610 is mounted so that light passing through the filter 610 may be incident to the image sensor 810.

The substrate 800 is disposed under the holder 600, and the image sensor 810 may be mounted on the substrate 600.

The image sensor 810 is apart where light passing through the filter 610 is incident and an image including the light is formed.

The substrate 800 may include various circuits, elements, controllers, etc. to convert an image formed by the image sensor 810 into an electrical signal and transmit it to an external device.

The substrate 800 may be implemented as a substrate on which an image sensor may be mounted, a circuit pattern may be formed, and various elements may be coupled. The holder 600 may be referred to as a "sensor base", and the substrate 800 may be referred to as a "circuit board".

In another embodiment, some regions of the substrate 800 may be implemented to be included in the lens driving unit 100 or not included in the lens driving unit 100.

The image sensor 810 may receive an image included in light incident through the lens driving unit 100 and convert the received image into an electrical signal.

The filter 610 and the image sensor 810 may be spaced apart from each other so as to face each other in the optical axis direction.

The motion sensor 820 is mounted on the substrate 800 and may be electrically connected to the controller 830 through a circuit pattern provided on the substrate 800.

The motion sensor 820 outputs rotational angular velocity information caused by the movement of the camera module 200. The motion sensor 820 may be implemented as a 2-axis or 3-axis gyro sensor or an angular velocity sensor.

The controller 830 is mounted on the substrate 800, may be electrically connected to the lens driving unit 100, and may provide a driving signal for driving the AF coil to the lens driving unit 100, a driving signal for driving the OIS coil, a driving signal for driving the AF position sensor, or/and a driving signal for driving an Optical Image Stabilization (OIS) position sensor.

In addition, the controller 830 may receive an output of an AF position sensor or/and an output of an OIS position sensor, may provide a driving signal for feedback AF driving to the AF coil using the output of the AF position sensor of the lens driving unit 100, and may provide a driving signal for feedback OIS driving to the OIS coil using the output of the OIS position sensor of the lens driving unit 100.

The connector 840 is electrically connected to the substrate 800 and may include a port for electrically connecting to an external device.

In addition, the lens driving unit 100 according to the embodiment forms an image of an object in space by using the characteristics of light such as reflection, refraction, absorption, interference, and diffraction, and may be included in an optical instrument for the purpose of increasing visual acuity of the eye, recording and reproducing an image by a lens, or optical measurement, propagation or transmission of an image, and the like. For example, the optical device according to the embodiment includes a mobile phone, a mobile phone, a smart phone, a portable smart device, a digital camera, a laptop computer, a digital broadcasting terminal, a personal digital assistant (PDA), and a portable multimedia player (PMP), and navigation, but is not limited thereto, and it is possible to use any device for taking images or photos.

Figure 10:
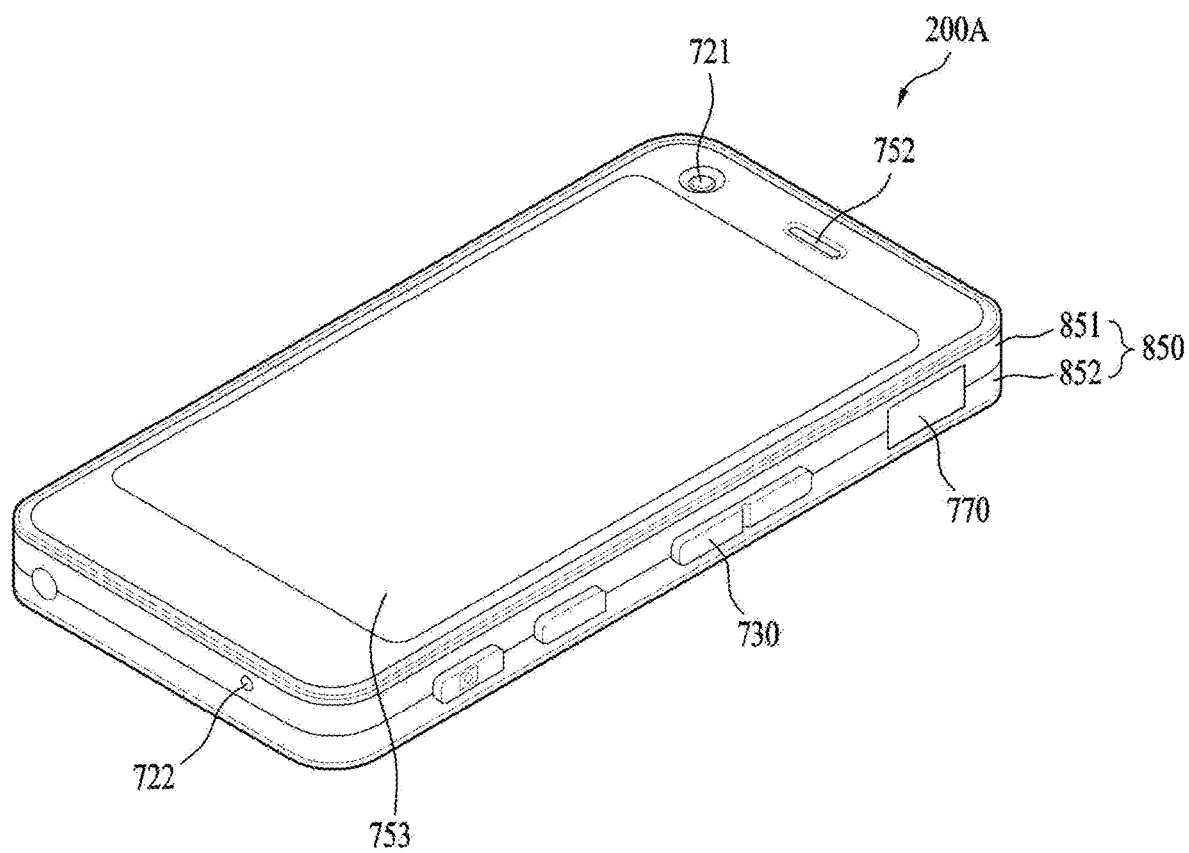
FIG. 10 is a perspective view of a portable terminal according to an embodiment.

FIG. 10 shows a perspective view of a portable terminal 200A according to an embodiment, and FIG. 11 shows a configuration diagram of the portable terminal shown in FIG. 9.

Referring to FIGS. 10 and 11, a portable terminal (200A, hereinafter referred to as a "terminal") may include a body 850, a wireless communication unit 710, an A/V input unit 720, a sensing unit 740, an input/output unit 750, a memory unit 760, an interface unit 770, a control unit 780, and a power supply unit 790.

The body 850 shown in FIG. 10 is in the form of a bar, but is not limited thereto, and there may be various structures such as a slide type, a folder type, a swing type, a swivel type, in which two or more sub-bodies are coupled to be movable relative to each other.

The body 850 may include a case (casing, housing, cover, etc.) forming an exterior. For example, the body 850 may be divided into a front case 851 and a rear case 852. Various electronic components of the terminal may be embedded in a space formed between the front case 851 and the rear case 852.

The wireless communication unit 710 may include one or more modules that enable wireless communication between the terminal 200A and the wireless communication system or between the terminal 200A and the network in which the terminal 200A is located. For example, the wireless communication unit 710 may include a broadcast reception module 711, a mobile communication module 712, a wireless internet module 713, a short-range communication module 714, and a location information module 715.

The A/V (Audio/Video) input unit 720 is for inputting an audio signal or a video signal, and may include a camera 721 and a microphone 722 and the like.

The camera 721 may include a camera module according to the embodiment shown in FIG. 1 or 9.

The sensing unit may detect a current state of the terminal 200A, such as an opening/closing state of the terminal 200A, a position of the terminal 200A, a presence or absence of user contact, an orientation of the terminal 200A, acceleration/deceleration of the terminal 200A, etc. and generate a sensing signal for controlling the operation of the terminal 200A. For example, when the terminal 200A is in the form of a slide phone, it is possible to sense whether the slide phone is opened or closed. In addition, it is responsible for sensing functions related to whether the power supply unit 790 is supplied with power, whether the interface unit 770 is coupled to an external device, and the like.

The input/output unit 750 is for generating input or output related to sight, hearing, or touch. The input/output unit 750 may generate input data for operation control of the terminal 200A, and may also display information processed by the terminal 200A.

The input/output unit 750 may include a keypad unit 730, a display module 751, a sound output module 752, and a touch screen panel 753. The keypad unit 730 may generate input data in response to a keypad input.

The display module 751 may include a plurality of pixels whose color changes according to an electrical signal. For example, the display module 751 may include at least of a liquid crystal display, a thin film transistor-liquid crystal display, an organic light-emitting diode, a flexible display, three-dimensional display (3D display).

The sound output module 752 may output audio data received from the wireless communication unit 710 in a call signal reception, a call mode, a recording mode, a voice recognition mode, or a broadcast reception mode, or the like; or audio data stored in the memory unit 760.

The touch screen panel 753 may convert a change in capacitance generated due to a user's touch on a specific region of the touch screen into an electrical input signal.

The memory unit 760 may store a program for processing and control of the controller 780, and may temporarily store input/output data (eg, phone book, message, audio, still image, photo, video, etc.). For example, the memory unit 760 may store an image captured by the camera 721, for example, a photo or a moving picture.

The interface unit 770 serves as a passage for connecting with an external device connected to the terminal 200A. The interface unit 770 receives data from an external device, receives power and transmits it to each component inside the terminal 200A, or transmits data of the terminal 200A to an external device. For example, the interface unit 770 may include a wired/wireless headset port, an external charger port, a wired/wireless data port, a memory card port, a port for connecting a device having an identification module, and an audio I/O (Input/Output) port, video I/O (Input/Output) port, and an earphone port, and the like.

The controller (controller, 780) may control the overall operation of the terminal 200A. For example, the controller 780 may perform related control and processing for voice calls, data communications, video calls, and the like.

The controller 780 may include a multimedia module 781 for playing multimedia. The multimedia module 781 may be implemented within the controller 180 or may be implemented separately from the controller 780.

The controller 780 may perform a pattern recognition process capable of recognizing a handwriting input or a drawing input performed on the touch screen as characters and images, respectively.

The power supply unit 790 may receive external power or internal power under the control of the control unit 780 to supply power required for the operation of each component.

Although the embodiments of the present invention have been described with reference to the accompanying drawings, those skilled in the art to which the present invention pertains will be understood that the present invention may be implemented in other specific forms without modifying the technical spirit and essential features of the present invention. Therefore, it should be understood that the embodiments described above are illustrative in all aspects and not restrictive.

The invention claimed is:

1. A camera module comprising:
   a reinforcing plate;
   a substrate disposed on the reinforcing plate;
   a lens driving unit disposed on the substrate; and
   an adhesive layer disposed between the reinforcing plate and the substrate,
   wherein the substrate includes:
   a first cover layer including a plurality of holes; and
   a circuit pattern layer disposed on the first cover layer;
   wherein the adhesive layer includes a through portion disposed in the plurality of holes, and a protruding portion between the first cover layer and the reinforcing plate, and
   wherein an outer surface of the first cover layer, an outer surface of the protruding portion of the adhesive layer, and an outer surface of the reinforcing plate are separated by steps from one another.

2. The camera module of claim 1, wherein the first cover layer includes a first region in which the reinforcing plate is disposed, and
   wherein the plurality of holes are disposed in the first region.

3. The camera module of claim 1, wherein the circuit pattern layer includes a single circuit pattern overlapping the plurality of holes in an optical axis direction.

4. The camera module of claim 1,
   wherein the through portion is in contact with the circuit pattern layer through the plurality of holes; and wherein the protruding portion is in contact with a lower surface of the first cover layer, and wherein an area of the first protruding portion is greater than an area of the through portion.

5. The camera module of claim 4, wherein a thickness of the protruding portion of the adhesive layer is smaller than a thickness of the through portion.

6. The camera module of claim 1, wherein the steps include a first step provided between the outer surface of the first cover layer and the outer surface of the protruding portion of the adhesive layer, and a second step provided between the outer surface of the protruding portion of the adhesive layer and the outer surface of the reinforcing plate.

7. The camera module of claim 1, wherein the circuit pattern layer includes:
a first portion in contact with the first cover layer; and
a second part in contact with the adhesive layer through the plurality of holes,
wherein an area of the first portion of the circuit pattern layer is greater than an area of the second portion of the circuit pattern layer.

8. The camera module of claim 1, wherein the adhesive layer includes a conductive particle connecting the circuit pattern layer and the reinforcing plate.

9. The camera module of claim 1, wherein each of the plurality of holes has a diameter in a range of 0.1 mm to 0.5 mm, and
wherein a distance between centers of adjacent holes of the plurality of holes ranges from 0.8 mm to 1.2 mm.

10. The camera module of claim 3, wherein the single circuit pattern layer includes a ground pattern, and
wherein the plurality of holes of the first cover layer and the reinforcing plate overlap each other in an optical axis direction.

11. The camera module of claim 1, wherein the outer surface of the reinforcing plate is positioned at an outermost side, and
wherein the outer surface of the protruding portion of the adhesive layer is positioned at an innermost side.

12. A camera module comprising:
a reinforcing plate;
a substrate disposed on the reinforcing plate;
a lens driving unit disposed on the substrate; and
an adhesive layer disposed between the reinforcing plate and the substrate,
wherein the substrate includes:
a first cover layer including a plurality of holes; and
a ground pattern disposed on the first cover layer;
wherein the adhesive layer includes a through portion disposed in the plurality of holes, and a protruding portion between the first cover layer and the reinforcing plate, and
wherein an outer surface of the first cover layer, an outer surface of the protruding portion of the adhesive layer, and an outer surface of the reinforcing plate are separated by steps from one another.

13. The camera module of claim 12, wherein the ground pattern and the reinforcing plate overlap in an optical axis direction.

14. The camera module of claim 12, wherein the first cover layer includes a first region in which the reinforcing plate is disposed, and
wherein the plurality of holes are disposed in the first region.

15. The camera module of claim 12, wherein the through portion is in contact with the circuit pattern layer through the plurality of holes; and
wherein the protruding portion is in contact with a lower surface of the first cover layer,
wherein an area of the protruding portion is greater than an area of the through portion.

16. The camera module of claim 12, wherein the steps include a first step provided between the outer surface of the first cover layer and the outer surface of the protruding portion of the adhesive layer, and a second step provided between the outer surface of the protruding portion of the adhesive layer and the outer surface of the reinforcing plate.

17. The camera module of claim 12, wherein the adhesive layer includes a conductive particle connecting the ground pattern and the reinforcing plate.

18. The camera module of claim 12, wherein each of the plurality of holes has a diameter in a range of 0.1 mm to 0.5 mm, and
wherein a distance between centers of adjacent holes of the plurality of holes ranges from 0.8 mm to 1.2 mm.

19. The camera module of claim 12, wherein the outer surface of the reinforcing plate is positioned at an outermost side, and
wherein the outer surface of the protruding portion of the adhesive layer is positioned at an innermost side.

20. A camera module comprising:
a first reinforcing plate;
a first substrate disposed on the first reinforcing plate;
a lens driving unit disposed on the first substrate;
a first adhesive layer disposed between the first reinforcing plate and the first substrate,
a second reinforcing plate;
a second substrate disposed on the second reinforcing plate;
a connector disposed on the second substrate;
a shielding sheet disposed between the second reinforcing plate and the second substrate; and,
a connection substrate electrically connecting the first substrate and the second substrate;
wherein the first substrate includes:
a first cover layer including a plurality of holes; and
a circuit pattern layer disposed on the first cover layer;
wherein the adhesive layer is adhered to the circuit pattern layer through the plurality of holes,
wherein the second substrate includes a second cover layer including an open region, and
wherein at least a portion of the shielding sheet is disposed in the open region.

* * * * *